US012747497B2

(12) United States Patent
Lee et al.

(10) Patent No.: US 12,747,497 B2
(45) Date of Patent: Sep. 29, 2026

(54) SUBSTRATE PROCESSING TUBE, SUBSTRATE PROCESSING APPARATUS INCLUDING THE SAME, AND SUBSTRATE PROCESSING METHOD USING THE APPARATUS

(71) Applicant: Samsung Electronics Co., Ltd., Suwon-si (KR)

(72) Inventors: Hyunju Lee, Suwon-si (KR); Byeonghoon Kim, Suwon-si (KR); Hyouncheol Kim, Suwon-si (KR); Jaehyung Lee, Suwon-si (KR); Byunghwan Kong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 606 days.

(21) Appl. No.: 18/125,435

(22) Filed: Mar. 23, 2023

(65) Prior Publication Data

US 2024/0011154 A1 Jan. 11, 2024

(30) Foreign Application Priority Data

Jul. 7, 2022 (KR) ........................ 10-2022-0084031

(51) Int. Cl.

| | |
|---|---|
| ***C23C 16/455*** | (2006.01) |
| ***C23C 16/458*** | (2006.01) |
| ***C23C 16/46*** | (2006.01) |
| ***H10P 72/10*** | (2026.01) |

(52) U.S. Cl.

CPC .... *C23C 16/45502* (2013.01); *C23C 16/4583* (2013.01); *C23C 16/46* (2013.01); *H10P 72/14* (2026.01)

(58) Field of Classification Search

CPC .......... C23C 16/4583; C23C 16/45502; C23C 16/45578; H01L 21/6732

See application file for complete search history.

(56) References Cited

U.S. PATENT DOCUMENTS

| | | | |
|---|---|---|---|
| 8,163,246 B2 | 4/2012 | Sato et al. | |
| 10,525,430 B2 | 1/2020 | Hazeltine | |
| 11,208,721 B2 | 12/2021 | Fukushima et al. | |
| 2009/0159004 A1* | 6/2009 | Yoshioka | C23C 16/45578 118/715 |
| 2015/0315702 A1 | 11/2015 | Yamaguchi et al. | |
| 2019/0287829 A1* | 9/2019 | Saido | C23C 16/45546 |
| 2021/0147978 A1* | 5/2021 | Hisakado | C23C 16/4412 |

FOREIGN PATENT DOCUMENTS

| | | |
|---|---|---|
| KR | 10-2006-0074589 A | 7/2006 |
| KR | 10-2006-0077997 A | 7/2006 |
| KR | 10-0688705 B1 | 2/2007 |
| KR | 10-2008-0017548 A | 2/2008 |
| KR | 10-1247109 B1 | 4/2013 |
| KR | 10-1555238 B1 | 9/2015 |

* cited by examiner

*Primary Examiner* — Joseph A Miller, Jr.
(74) *Attorney, Agent, or Firm* — Muir Patent Law, PLLC

(57) ABSTRACT

A substrate processing apparatus may include an inner tube providing a process space extending vertically, an outer tube enclosing the inner tube, a gas supplying conduit connected to the process space, and a boat configured to be disposed in the process space. A first inner diameter of the inner tube at a first position may be different from a second inner diameter of the inner tube at a second position, and a level of the second position may be higher than a level of the first position.

20 Claims, 22 Drawing Sheets

SUBSTRATE PROCESSING TUBE, SUBSTRATE PROCESSING APPARATUS INCLUDING THE SAME, AND SUBSTRATE PROCESSING METHOD USING THE APPARATUS

CROSS-REFERENCE TO RELATED APPLICATIONS

This U.S. non-provisional patent application claims priority under 35 U.S.C. § 119 to Korean Patent Application No. 10-2022-0084031, filed on Jul. 7, 2022, in the Korean Intellectual Property Office, the entire contents of which are hereby incorporated by reference.

BACKGROUND OF THE INVENTION

The present disclosure relates to a substrate processing tube, a substrate processing apparatus including the same, and a substrate processing method using the apparatus, and in particular, to a substrate processing tube configured to improve a gas uniformity issue, a substrate processing apparatus including the same, and a substrate processing method using the apparatus.

A process of fabricating a semiconductor device includes various process steps. For example, a semiconductor device may be fabricated by performing a deposition process, a photolithography process, an etching process, and a cleaning process on a substrate. The processes are performed in respective substrate processing apparatuses. For example, a batch system having a vertical-type furnace is used for the deposition process. The process is performed on a plurality of substrates, which are vertically stacked in the batch system. For example, a process gas is supplied into the batch system, in which the substrates are loaded, and in this case, the deposition process is simultaneously performed on the substrates.

SUMMARY

An embodiment of the inventive concept provides a substrate processing tube, which is configured to control flow of a process gas, a substrate processing apparatus including the same, and a substrate processing method using the apparatus.

An embodiment of the inventive concept provides a substrate processing tube, which is configured to uniformly distribute a process gas, a substrate processing apparatus including the substrate processing tube, and a substrate processing method using the apparatus.

An embodiment of the inventive concept provides a substrate processing tube, which is configured to increase a production yield in a fabrication process, a substrate processing apparatus including the same, and a substrate processing method using the apparatus.

According to an embodiment of the inventive concept, a substrate processing apparatus may include an inner tube providing a process space extending vertically, an outer tube enclosing the inner tube, a gas supplying conduit connected to the process space, and a boat configured to be disposed in the process space. A first inner diameter of the inner tube at a first position may be different from a second inner diameter of the inner tube at a second position, and a level of the second position may be higher than a level of the first position.

According to an embodiment of the inventive concept, a substrate processing tube may include a first inner tube providing a first process space configured such that a deposition process on a first substrate is performed in the first process space, and a second inner tube providing a second process space configured such that a deposition process on a second substrate is performed in the second process space. The first process space may extend in a vertical direction, and the second process space may be connected to the first process space and may extend from the first process space in the vertical direction. The second process space may include a region whose horizontal width is different from a horizontal width of the first process space.

According to an embodiment of the inventive concept, a substrate processing apparatus may include an inner tube providing a process space which extends in a first direction, an outer tube enclosing the inner tube and extending in the first direction, a gas supplying conduit connected to the process space, and a boat configured to move in and to move out of the process space. When the boat is placed in the process space, a first horizontal distance between the boat and an inner side surface of the inner tube at a first position may be different from a second horizontal distance between the boat and the inner side surface of the inner tube at a second position, and the second position may be spaced apart from the first position in the first direction.

According to an embodiment of the inventive concept, a substrate processing method may include supplying a process gas into a substrate processing apparatus, depositing the process gas on a substrate to form a material layer on the substrate in the substrate processing apparatus, and exhausting a remaining portion of the process gas from the substrate processing apparatus. Here, the substrate processing apparatus may include an inner tube providing a process space which extends in a first direction, an outer tube enclosing the inner tube, a gas supplying conduit connected to the process space, and a boat disposed in the process space to support a plurality of substrates. The supplying of the process gas may include supplying the process gas into the process space through the gas supplying conduit, moving the process gas, which is supplied into the process space, in the first direction through an inner space of the inner tube, and moving a portion of the process gas to the substrate on the boat. A first inner diameter of the inner tube at a first position may be different from a second inner diameter of the inner tube at a second position.

DETAILED DESCRIPTION

Example embodiments of the inventive concepts will now be described more fully with reference to the accompanying drawings, in which example embodiments are shown.

Figure 1:
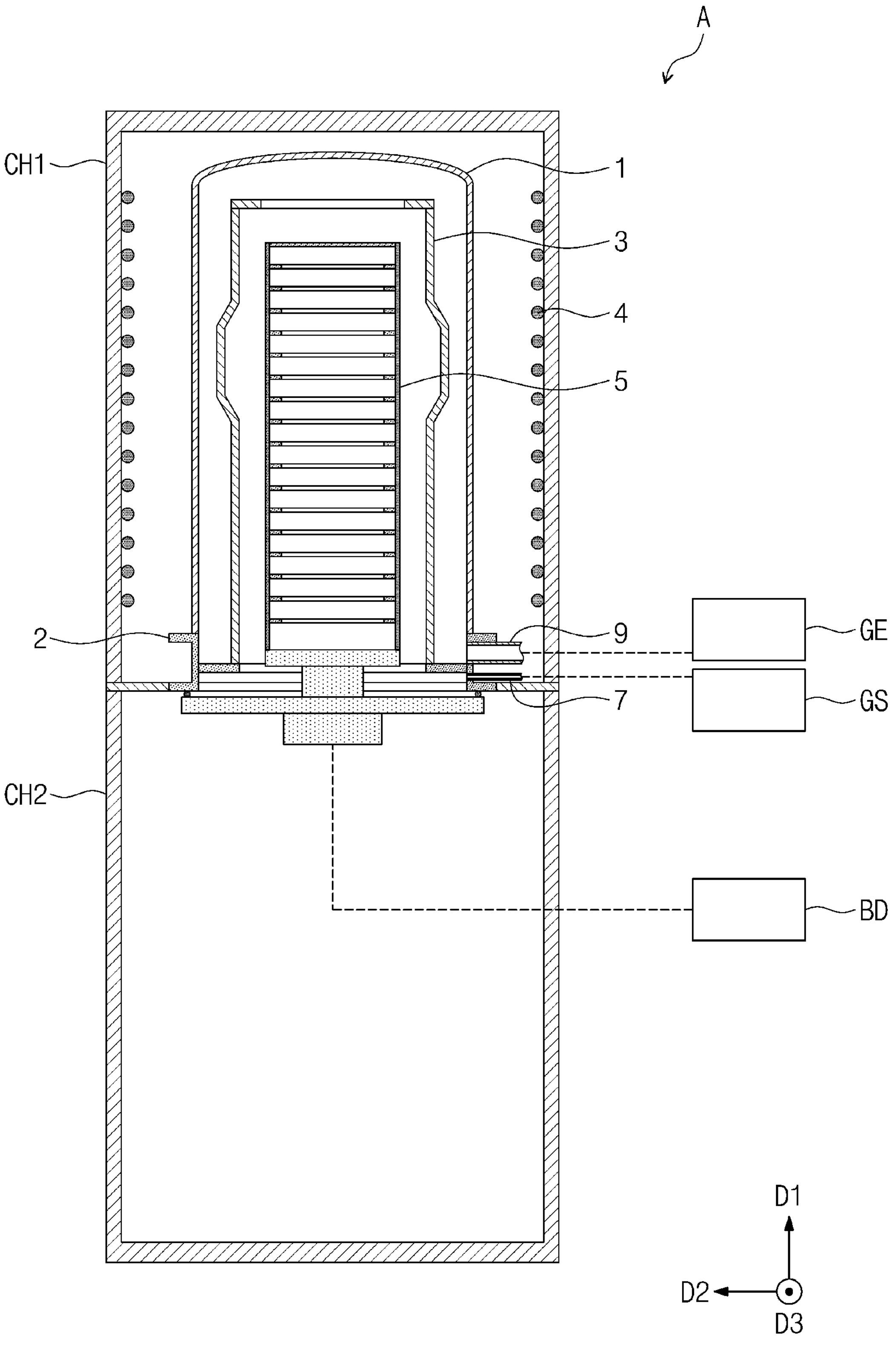
FIG. 1 is a sectional view illustrating a substrate processing apparatus according to an embodiment of the inventive concept.

FIG. 1 is a sectional view illustrating a substrate processing apparatus according to an embodiment of the inventive concept.

In the present application, the references/symbols D1, D2, and D3 will be used to denote a first direction, a second direction, and a third direction, respectively, which are not parallel to each other. The first direction D1 may be referred to as a vertical direction. In addition, each of the second and third directions D2 and D3 may be referred to as a horizontal direction.

Referring to FIG. 1, a substrate processing apparatus A may be provided. The substrate processing apparatus A may be an apparatus, which is used to perform a process of treating a semiconductor substrate. In the present specification, the substrate may be a silicon wafer, but the inventive concept is not limited to this example. The term "substrate" may denote a substrate itself, or a stack structure including a substrate and predetermined layers or films formed on a surface of the substrate. The substrate processing apparatus A may be configured to perform a deposition process on a substrate, e.g., to form a material layer on the substrate. For example, the substrate processing apparatus A may be configured to perform a low pressure chemical vapor deposition (LPCVD) process on a substrate. However, the inventive concept is not limited to this example, and in an embodiment, the substrate processing apparatus A may be configured to perform other deposition processes (e.g., an atomic layer deposition (ALD) process). The process may be performed on a plurality of substrates, which are stacked in the substrate processing apparatus A. For this, the substrate processing apparatus A may include an upper chamber CH1, a lower chamber CH2, an outer tube 1, an inner tube 3, a boat 5, a gas supplying conduit 7, a gas exhausting conduit 9, a flange 2, and a heater 4. In an embodiment, the substrate processing apparatus A may further include a gas supplying part GS, a gas exhausting part GE, and a boat driving part BD.

The upper chamber CH1 may be provided to enclose the outer tube 1 and the inner tube 3. For example, the outer tube 1, the inner tube 3, and the heater 4 may be disposed in the upper chamber CH1. The upper chamber CH1 may be configured to support the heater 4. For example, the heater 4 may be combined to an inner wall of the upper chamber CH1. However, the inventive concept is not limited to this example, and in an embodiment, the heater 4 may be provided to be spaced apart from the inner wall of the upper chamber CH1.

The lower chamber CH2 may be disposed below the upper chamber CH1. The boat 5 may be configured to move from the lower chamber CH2 to the upper chamber CH1 or vice versa in a vertical direction. The substrate may be loaded on the boat 5 when the boat 5 is disposed in the lower chamber CH2. The process on the substrate may be performed when the boat 5 is placed in the upper chamber CH1.

The outer tube 1 may be provided to enclose the inner tube 3. An empty space may be provided between the outer tube 1 and the inner tube 3. For example, an inner side surface of the outer tube 1 may be spaced apart from an outer side surface of the inner tube 3. The outer tube 1 may be placed in the upper chamber CH1. The outer tube 1 may extend in the first direction D1. The outer tube 1 may be formed of or include quartz, but the inventive concept is not limited to this example. The outer tube 1 may be provided to enclose the inner tube 3. A top of the outer tube 1 may be closed. The outer tube 1 will be described in more detail below.

The inner tube 3 may be placed in the outer tube 1. The inner tube 3 may extend in the first direction D1. The boat 5 may be disposed in the inner tube 3. For example, the boat 5 may move in an upward direction and may be inserted/disposed into the upper chamber CH1 to place the boat 5 in the inner tube 3. The inner tube 3 may be formed of or include quartz, but the inventive concept is not limited to this example. An inner diameter of the inner tube 3 may not be constant. For example, the inner diameter of the inner tube 3 may vary depending on a vertical height. This will be described in more detail below.

The boat 5 may be configured to support the substrate. For example, the substrate may be placed on the boat 5. A plurality of substrates may be loaded on one boat 5. The substrates on the boat 5 may be arranged in the first direction D1. Nevertheless, the description below will refer to one of the substrates, for convenience in description. For example, each of the plurality of substrates may be at an identical situation to the substrate described below/above. The boat 5 may be configured to move in a vertical direction. For example, the boat 5 may be moved in an upward or downward direction by the boat driving part BD.

The gas supplying conduit 7 may be connected to a space in the inner tube 3. For example, the gas supplying conduit 7 may be connected to a process space 3*h* (e.g., see FIG. 2). The gas supplying conduit 7 may be used to supply a process gas into the inner tube 3. The process gas, which is supplied by the gas supplying conduit 7, may be used in a deposition process on a substrate on the boat 5.

The gas exhausting conduit 9 may be connected to a space in the outer tube 1. For example, the gas exhausting conduit 9 may be connected to a space between the inner tube 3 and the outer tube 1. The gas exhausting conduit 9 may be used to exhaust/discharge the process gas, which is supplied through the gas supplying conduit 7, to the outside.

The flange 2 may be located below the outer tube 1. For example, the flange 2 may contact a bottom surface of the outer tube 1. The flange 2 may support the outer tube 1 and/or the inner tube 3. Alternatively, the flange 2 may be provided to enclose the inner tube 3. The gas supplying conduit 7 and/or the gas exhausting conduit 9 may be connected to the flange 2. For example, the gas supplying conduit 7 and the gas exhausting conduit 9 may be inserted to respective holes formed in the flange 2.

The heater 4 may be disposed in the upper chamber CH1. For example, the heater 4 may be placed on and combined to the inner wall of the upper chamber CH1. The heater 4 may be used to heat the outer tube 1 and/or the inner tube 3. For this, the heater 4 may include a heating line. In an embodiment, a plurality of heating lines may be provided. The heating lines may be arranged in the first direction D1. The heating lines may be individually controlled. For example, the heating lines may be controlled to have different temperatures from each other.

The gas supplying part GS may be configured to supply the process gas into the inner tube 3. The gas supplying part GS may be connected to the gas supplying conduit 7. The gas supplying part GS may be configured to supply the process gas into the inner tube 3 through the gas supplying conduit 7. For this, the gas supplying part GS may include a gas tank, a compressor, or the like.

The gas exhausting part GE may be configured to exhaust/discharge the process gas in the outer tube 1 to the outside. The gas exhausting part GE may be connected to the gas exhausting conduit 9. The gas exhausting part GE may exhaust/discharge the process gas in the outer tube 1 to the outside through the gas exhausting conduit 9. For this, the gas exhausting part GE may include a vacuum pump or the like. For example, the gas exhausting part GE may be a gas exhaust machine.

The boat driving part BD may be configured to move the boat 5. For example, the boat driving part BD may be configured to move the boat 5 in a vertical direction. For this, the boat driving part BD may include an actuator (e.g., a motor). For example, the boat driving part BD may a boat driver.

Spatially relative terms, such as "beneath," "below," "lower," "above," "upper," "top," "bottom" and the like, may be used herein for ease of description to describe positional relationships. It will be understood that the spatially relative terms encompass different orientations of the device in addition to the orientation depicted in the figures.

Figure 2:
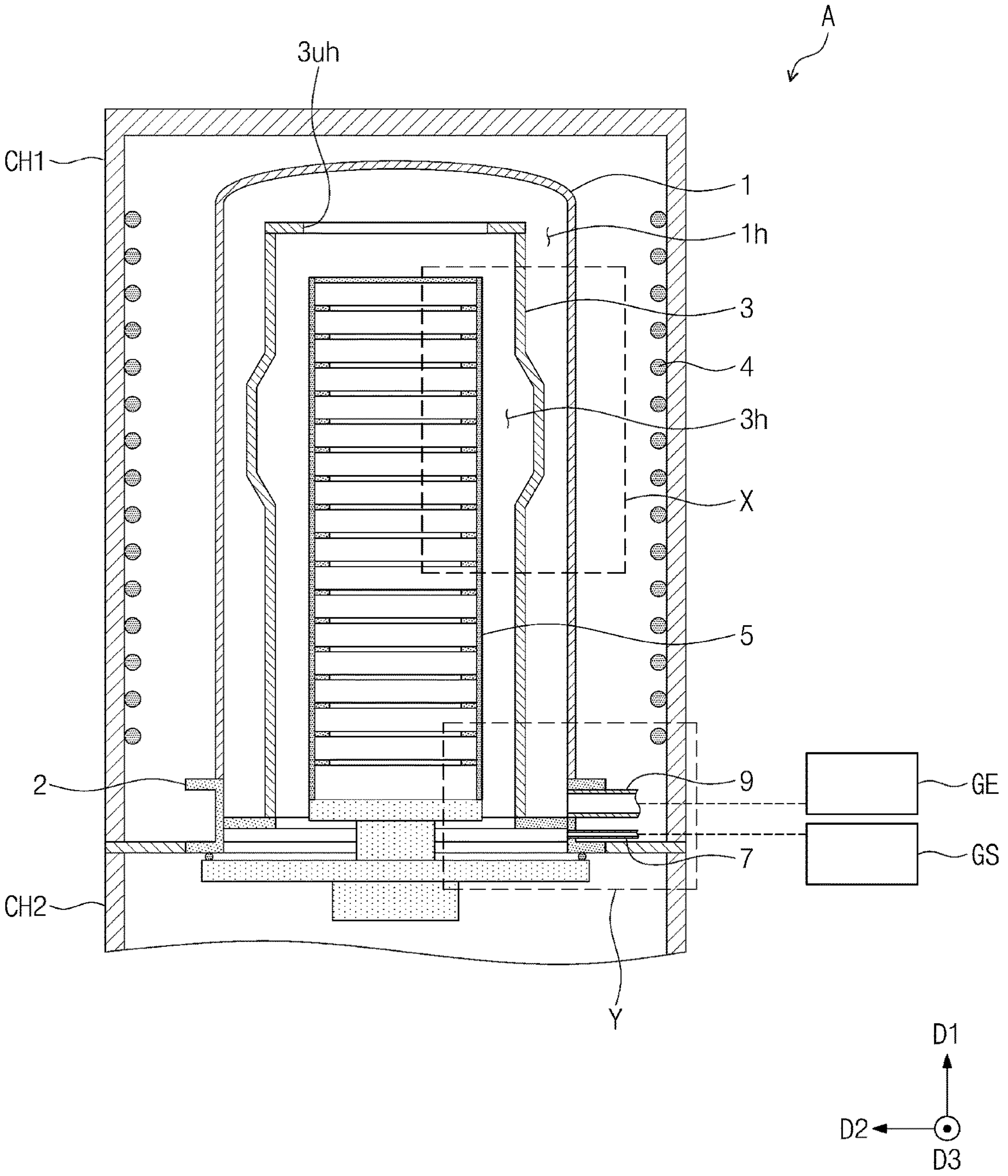
FIG. 2 is a sectional view illustrating a portion of a substrate processing apparatus according to an embodiment of the inventive concept.

FIG. 2 is a sectional view illustrating a portion of a substrate processing apparatus according to an embodiment of the inventive concept.

Referring to FIG. 2, the inner tube 3 may provide the process space 3*h*. The process space 3*h* may extend in the first direction D1. The outer tube 1 may provide an outer space 1*h*. The outer space 1*h* may be/include a space between the inner side surface of the outer tube 1 and the outer side surface of the inner tube 3.

A top portion of the inner tube 3 may be open. For example, an outlet 3*uh* may be provided in the top portion of the inner tube 3. Thus, the process space 3*h* may be connected to the outer space 1*h* through the outlet 3*uh.*

So far, an example, in which the top portion of the inner tube 3 is open and the process space 3*h* is connected to the outer space 1*h*, has been described and illustrated, but the inventive concept is not limited to this example. For example, the top portion of the inner tube 3 may be closed. This will be described in more detail with reference to FIG. 17.

Figure 3:
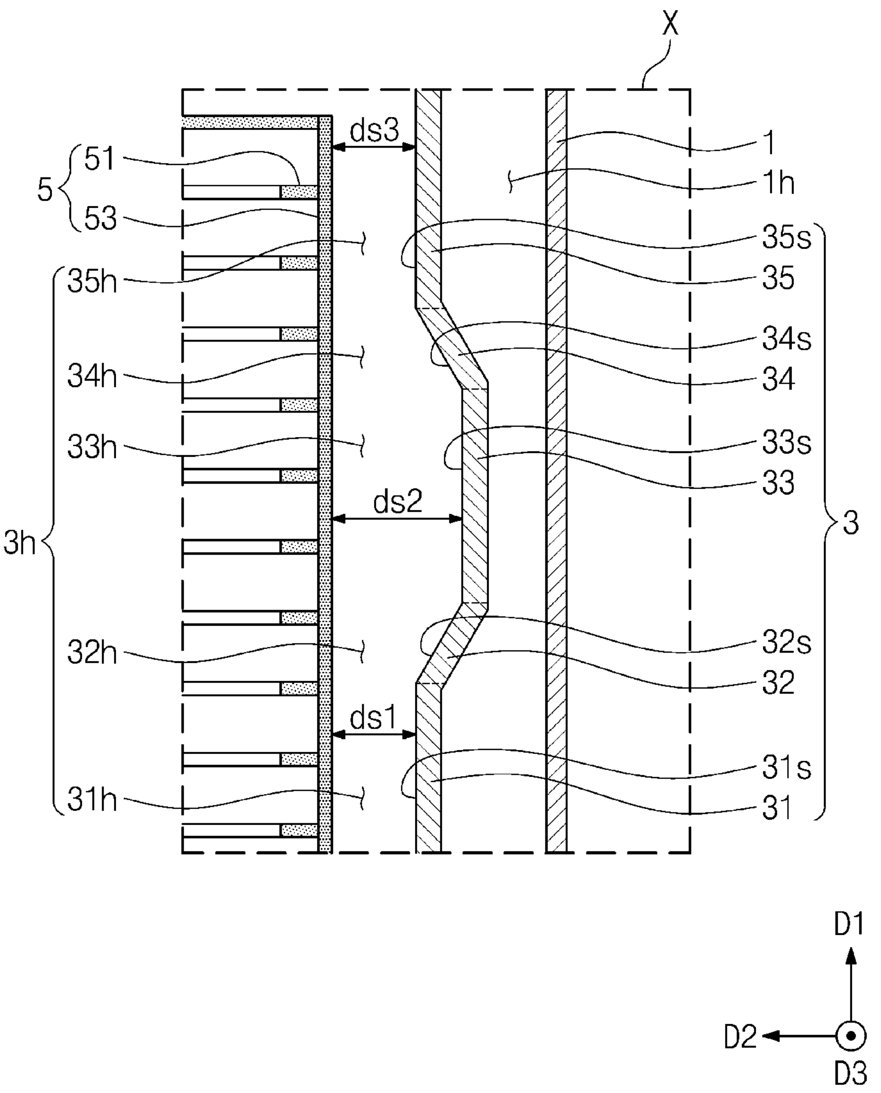
FIG. 3 is an enlarged sectional view illustrating a portion X of FIG. 2.

FIG. 3 is an enlarged sectional view illustrating a portion X of FIG. 2.

Referring to FIG. 3, the boat 5 may include a substrate supporting member 51 and a connection member 53.

The substrate supporting member 51 may be configured to support a substrate. The substrate supporting member 51 may have a shape that extends in a horizontal direction, but the inventive concept is not limited to this example. In an embodiment, a plurality of substrate supporting members (e.g., substrate supports) 51 may be provided. The substrate supporting members 51 may be arranged in the first direction D1. For example, the substrate supports 51 may be arranged along a vertical direction and/or may fully overlap each other in the vertical direction.

The connection member (e.g., connector) 53 may extend in the first direction D1. The connection member 53 may be configured to support the substrate supporting members 51.

The inner diameter of the inner tube 3 may not be constant. Accordingly, a first horizontal distance ds1 between an inner side surface of the inner tube 3 and the boat 5 at a first position may be different from a second horizontal distance ds2 between the inner side surface of the inner tube 3 and the boat 5 at a second position. In the present specification, the term of "horizontal distance" between two elements may be used to represent the shortest distance between the elements in the horizontal direction. A level of the second position may be different from a level of the first position. For example, the level of the second position may be higher than the level of the first position. In the present specification, the term "level" of a position may be used to represent a height of the position. For example, the level may be a value representing a distance from the gas supplying conduit 7 (e.g., see FIG. 2) in the first direction D1. In the case where the inner tube 3 includes a portion whose inner diameter is different from the remaining portion, the portion with the different inner diameter may be horizontally overlapped with the boat 5, when the boat 5 is disposed in the inner tube 3. For example, the level of the second position may be lower than a level of the uppermost one of the substrates supporting members 51. For this, the inner tube 3 may include, for example, a first inner tube 31, a second inner tube 32, a third inner tube 33, a fourth inner tube 34, and a fifth inner tube 35. For example, an inner diameter may be a diameter of a circle formed by an inner surface of an inner tube in a cross-sectional view or a diameter of a cylindrical shape or a cone shape of an inner surface of an inner tube. For example, inner diameters may be respective distances between opposite inner surfaces in a horizontal direction.

The first inner tube 31 may provide a first process space 31*h*, which extends in the first direction D1. The first process space 31*h* may be used for a deposition process, which is performed on a substrate disposed therein. An inner diameter of the first inner tube 31 may be constant. Thus, a distance between an inner side surface 31*s* of the first inner tube 31 and the boat 5 may be constant. The distance will be referred to as the first horizontal distance ds1. In this case, the first position may be a position, at which the first inner tube 31 is disposed.

The second inner tube 32 may be placed on/above the first inner tube 31. The second inner tube 32 may provide a second process space 32*h*, which extends in the first direction D1. For example, the second inner tube 32 may upwardly extend from a top of the first inner tube 31. The second process space 32*h* may be used for a deposition process, which is performed on a substrate disposed therein. An inner diameter of the second inner tube 32 may not be constant. For example, the inner diameter of the second inner tube 32 may increase in an upward direction. For example, the inner diameter of the second inner tube 32 may gradually increase in a direction moving upwards. Thus, a distance between an inner side surface 32$s$ of the second inner tube 32 and the boat 5 may not be constant. For example, a distance between the inner side surface 32$s$ of the second inner tube 32 and the boat 5 may increase in an upward direction. For example, horizontal distances between the inner side surface 32$s$ of the second inner tube 32 and the boat 5 may gradually increase in a direction moving upwards.

The third inner tube 33 may be placed on/above the second inner tube 32. The third inner tube 33 may provide a third process space 33$h$, which extends in the first direction D1. For example, the third inner tube 33 may extend upwards from a top of the second inner tube 32. The third process space 33$h$ may be used for a deposition process, which is performed on a substrate disposed therein. An inner diameter of the third inner tube 33 may be constant. Thus, a distance between an inner side surface 33$s$ of the third inner tube 33 and the boat 5 may be constant. This distance will be referred to as the second horizontal distance ds2. In this case, the second position may be a position, at which the third inner tube 33 is disposed. The level of the second position may be higher than the level of the first position. For example, the second position may be placed above the first position. In an embodiment, the second horizontal distance ds2 may be different from the first horizontal distance ds1. For example, the second horizontal distance ds2 may be larger than the first horizontal distance ds1.

The fourth inner tube 34 may be placed on/above the third inner tube 33. The fourth inner tube 34 may provide a fourth process space 34$h$, which extends in the first direction D1. For example, the fourth inner tube 34 may extend upwards from a top of the third inner tube 33. The fourth process space 34$h$ may be used for a deposition process, which is performed on a substrate disposed therein. An inner diameter of the fourth inner tube 34 may not be constant. For example, the inner diameter of the fourth inner tube 34 may decrease in an upward direction. Thus, a distance between an inner side surface 34$s$ of the fourth inner tube 34 and the boat 5 may not be constant. For example, a distance between the inner side surface 34$s$ of the fourth inner tube 34 and the boat 5 may decrease in an upward direction. For example, the inner diameter of the fourth inner tube 34 and distances between the inner side surface 34$s$ of the fourth inner tube 34 and the boat 5 may gradually decrease in a direction moving upwards.

The fifth inner tube 35 may be placed on/above the fourth inner tube 34. The fifth inner tube 35 may provide a fifth process space 35$h$, which extends in the first direction D1. For example, the fifth inner tube 35 may extend upwards from a top of the fourth inner tube 34. The fifth process space 35$h$ may be used for a deposition process, which is performed on a substrate disposed therein. An inner diameter of the fifth inner tube 35 may be constant. Thus, a distance between an inner side surface 35$s$ of the fifth inner tube 35 and the boat 5 may be constant. The distance will be referred to as a third horizontal distance ds3. In this case, a third position may be a position, at which the fifth inner tube 35 is disposed. A level of the third position may be higher than the level of the second position. For example, the third position may be located above the second position. The third horizontal distance ds3 may be different from the second horizontal distance ds2. For example, the third horizontal distance ds3 may be smaller than the second horizontal distance ds2. In an embodiment, the third horizontal distance ds3 may be substantially equal or similar to the first horizontal distance ds1. For example, the inner diameters of the first to fifth inner tubes 31, 32, 33, 34 and 35 may be the same as respective horizontal widths of the first to fifth process spaces 31$h$, 32$h$, 33$h$, 34$h$ and 35$h$.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

As described above, the inner tube 3 may include an intermediate portion of a convex shape.

The first process space 31$h$, the second process space 32$h$, the third process space 33$h$, the fourth process space 34$h$, and the fifth process space 35$h$ may be connected to each other to form one process space 3$h$.

The inner tubes 31, 32, 33, 34, and 35 may be connected to each other by, for example, a welding process, thereby forming a single inner tube 3. However, the inventive concept is not limited to this example, and in an embodiment, the inner tubes 31, 32, 33, 34, and 35 may be different parts of a structure, which is provided as a single object and is used as the inner tube 3.

Figure 4:
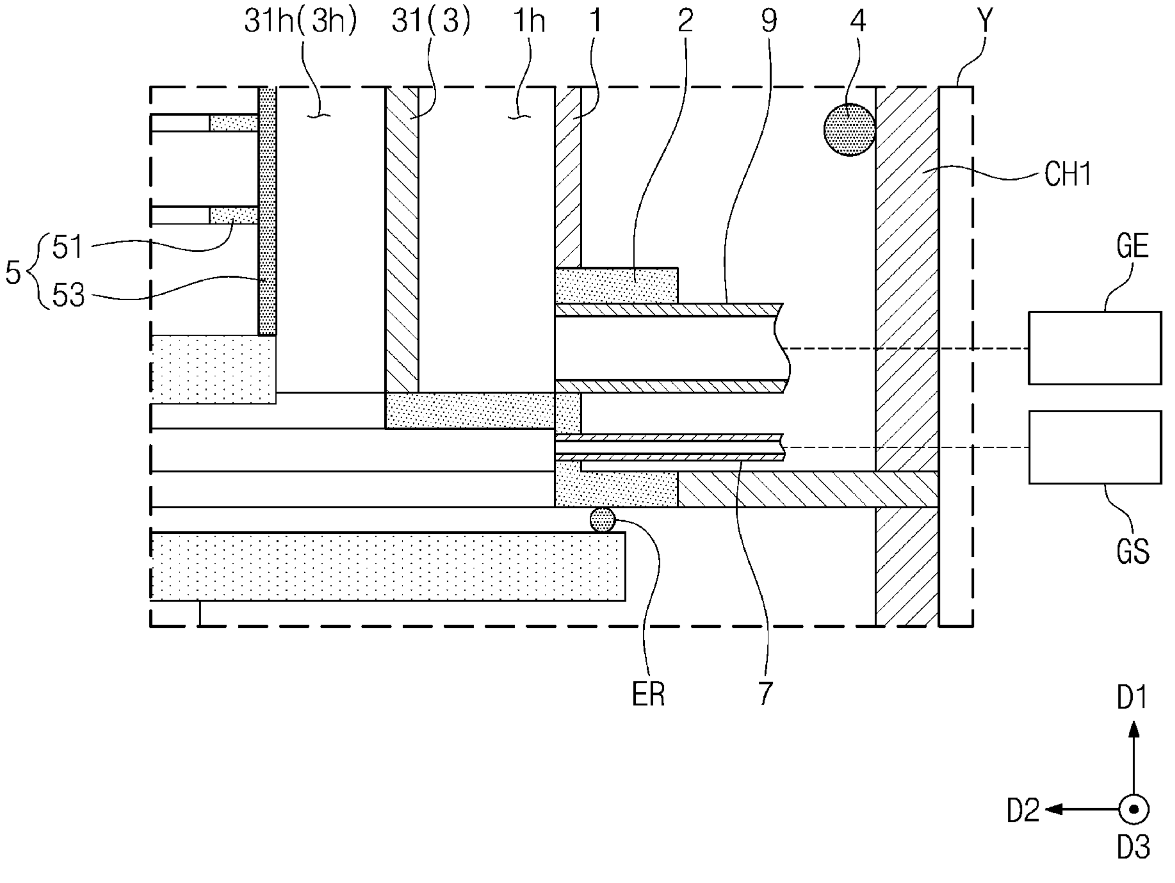
FIG. 4 is an enlarged sectional view illustrating a portion Y of FIG. 2.

FIG. 4 is an enlarged sectional view illustrating a portion Y of FIG. 2.

Referring to FIG. 4, the gas supplying conduit 7 may be connected to the flange 2. For example, the gas supplying conduit 7 may be provided to penetrate the flange 2 in a horizontal direction. In addition, the gas supplying conduit 7 may be connected to the process space 3$h$. A process gas, which is supplied from the gas supplying part GS, may be supplied into the process space 3$h$ through the gas supplying conduit 7. The process gas, which is supplied into the process space 3$h$, may move along the inner side surface of the inner tube 3 in an upward direction.

The gas exhausting conduit 9 may be connected to the flange 2. For example, the gas exhausting conduit 9 may be provided to penetrate the flange 2 in a horizontal direction. The gas exhausting conduit 9 may be connected to the outer space 1$h$. The process gas in the outer space 1$h$ may be exhausted/discharged to the gas exhausting part GE through the gas exhausting conduit 9.

A sealing element ER may be provided below the flange 2. The sealing element ER may be placed between a member (not referenced, e.g., a boat support or a boat stage), which is provided to support the boat 5, and the flange 2 and may be used to prevent the process gas in the process space 3$h$ and/or the outer space 1$h$ from leaking into a lower space (e.g., the lower chamber CH2).

Figure 5:
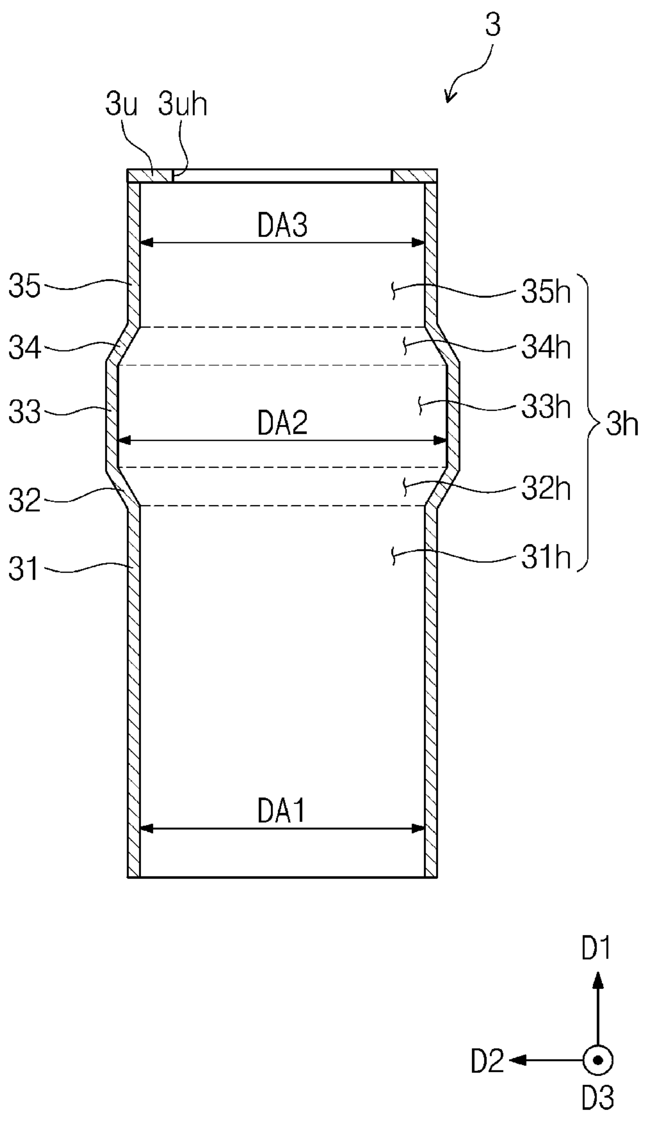
FIG. 5 is a sectional view illustrating an inner tube according to an embodiment of the inventive concept.
Figure 6:
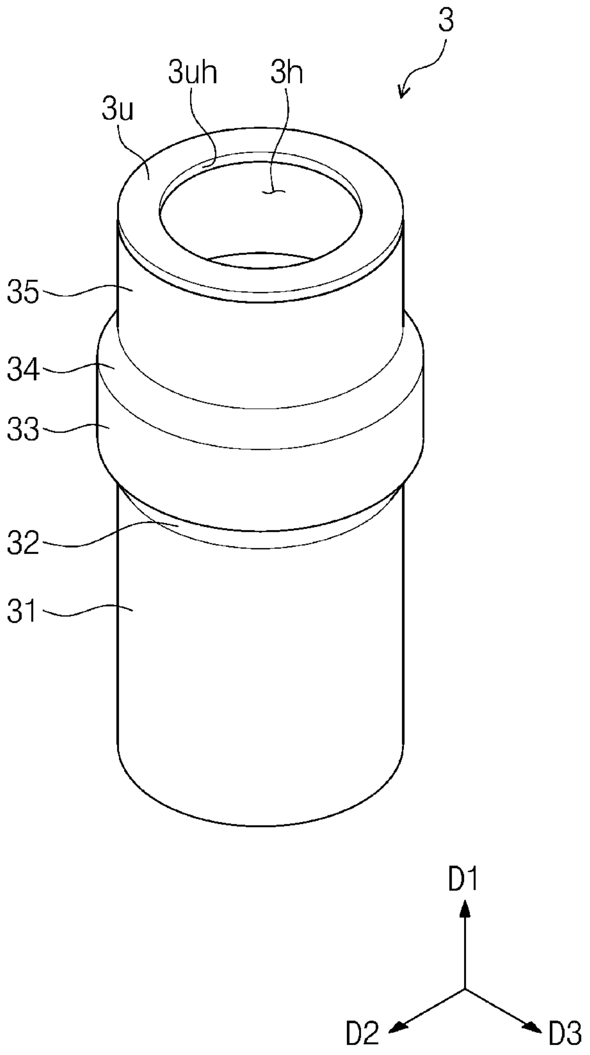
FIG. 6 is a perspective view illustrating an inner tube according to an embodiment of the inventive concept.

FIG. 5 is a sectional view illustrating an inner tube according to an embodiment of the inventive concept, and FIG. 6 is a perspective view illustrating an inner tube according to an embodiment of the inventive concept.

Referring to FIGS. 5 and 6, the inner diameter of the inner tube 3 may not be constant, as described above. The inner diameter of the first inner tube 31 will be referred to as a first inner diameter DA1. The first inner diameter DA1 may be in a range from 340 mm to 380 mm. For example, the first inner diameter DA1 may be about 360 mm.

The inner diameter of the second inner tube 32 may increase in an upward direction. For example, a width of the second process space 32$h$ may increase in a direction moving upwards, e.g., in the first direction D1.

The inner diameter of the third inner tube 33 will be referred to as a second inner diameter DA2. The second inner diameter DA2 may be different from the first inner diameter DA1. For example, a width of the third process space 33$h$ may be different from a width of the first process space 31$h$. In an embodiment, the second inner diameter DA2 may be larger than the first inner diameter DA1. The second inner diameter DA2 may be in a range from about 368 mm to about 408 mm. For example, the second inner diameter DA2 may be about 388 mm.

The inner diameter of the fourth inner tube 34 may decrease in an upward direction. For example, a width of the fourth process space 34*h* may decrease in a direction moving upwards, e.g., in the first direction D1.

The inner diameter of the fifth inner tube 35 will be referred to as a third inner diameter DA3. The third inner diameter DA3 may be different from the second inner diameter DA2. For example, a width of the fifth process space 35*h*, e.g., in a horizontal direction, may be different from the width of the third process space 33*h*, e.g., in the horizontal direction. In an embodiment, the third inner diameter DA3 may be smaller than the second inner diameter DA2. The third inner diameter DA3 may be substantially equal or similar to the first inner diameter DA1.

Referring to FIG. 6, a horizontal section of the process space 3*h* may have a circular shape. For example, all of the first to fifth process spaces 31*h* to 35*h* described with reference to FIG. 5 may have circular horizontal sections. For example, each of the first to fifth process spaces 31*h* to 35*h* may have a circular horizontal section.

Figure 7:
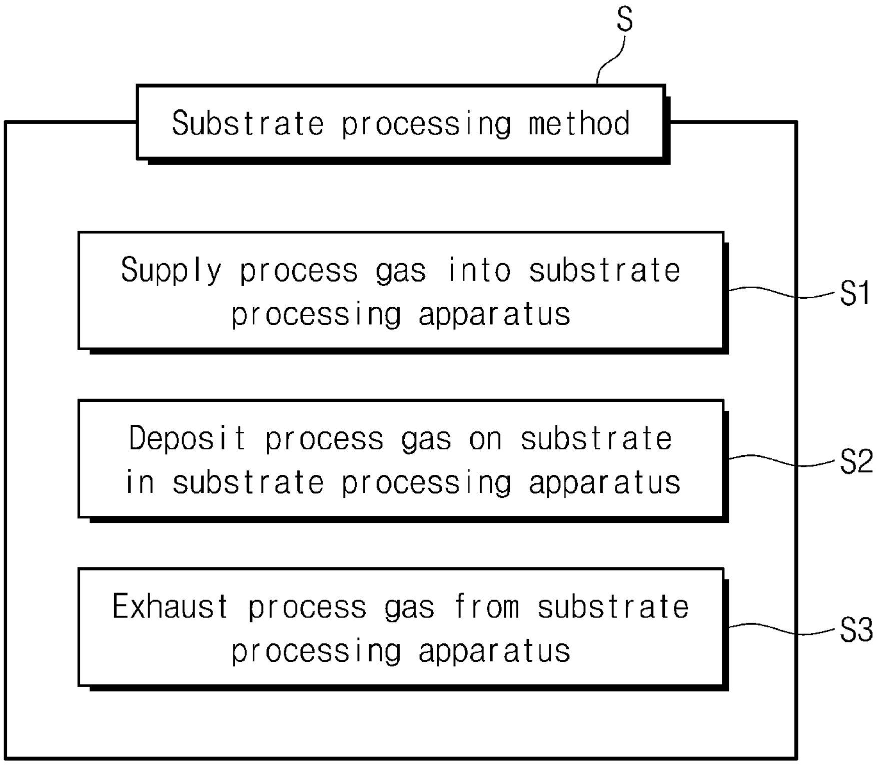
FIG. 7 is a flow chart illustrating a method of processing substrate, according to an embodiment of the inventive concept.

FIG. 7 is a flow chart illustrating a method of processing substrate, according to an embodiment of the inventive concept.

Referring to FIG. 7, a substrate processing method S may be provided. The substrate processing method S may be used for a process, which is performed on a substrate using the substrate processing apparatus A described with reference to FIGS. 1 to 6. The substrate processing method S may include supplying a process gas into the substrate processing apparatus (in S1), depositing the process gas on a substrate in the substrate processing apparatus (in S2), and exhausting/discharging the process gas from the substrate processing apparatus (in S3).

Hereinafter, the substrate processing method S of FIG. 7 will be sequentially described with reference to FIGS. 8 to 12.

FIGS. 8 to 12 are diagrams illustrating the substrate processing method according to the flow chart of FIG. 7.

Figure 8:
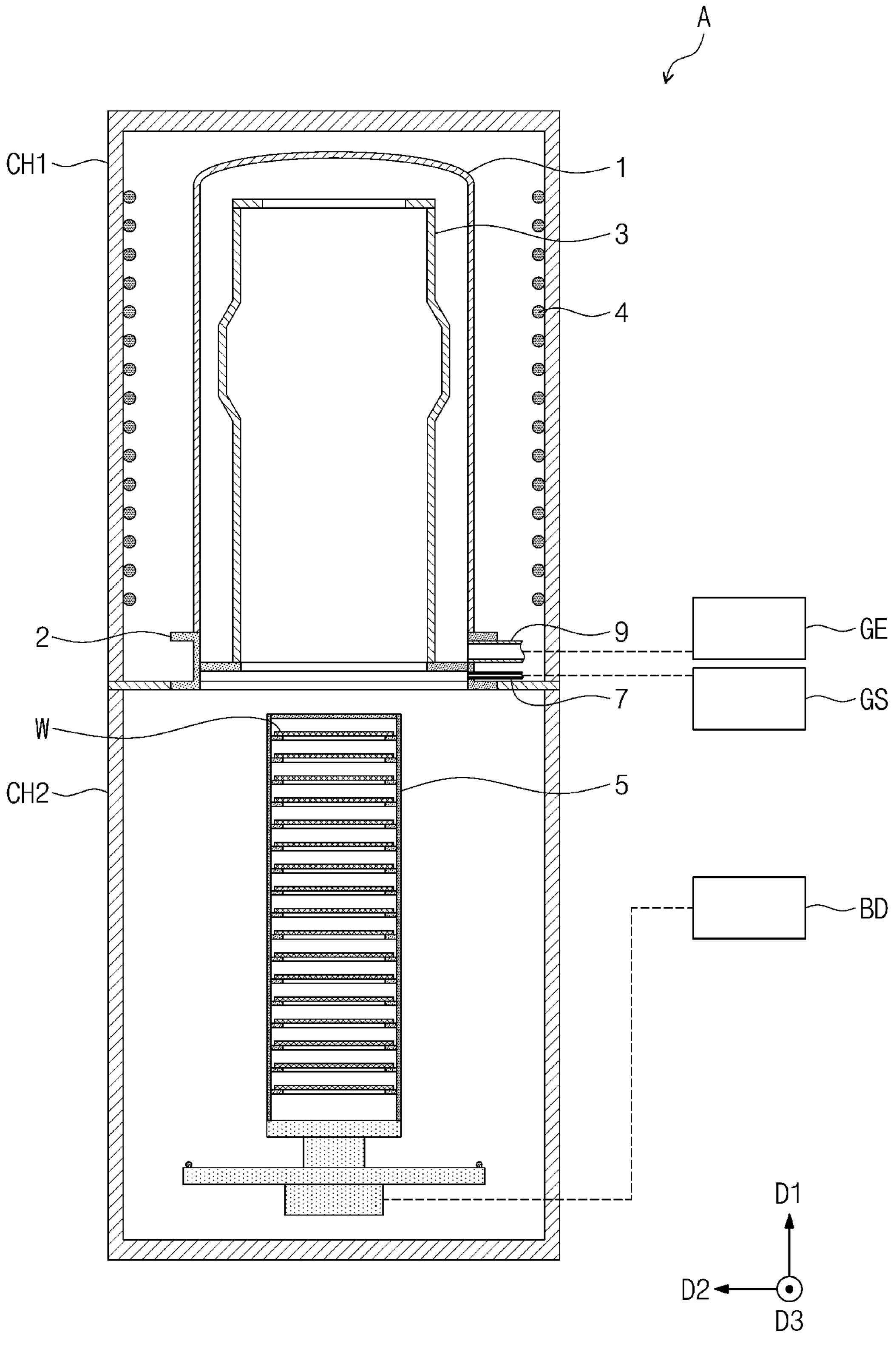
FIGS. 8 to 12 are diagrams illustrating the substrate processing method according to the flow chart of FIG. 7.

Referring to FIG. 8, a substrate W may be loaded on the boat 5. The loading of the substrate W may be performed when the boat 5 is placed in the lower chamber CH2. In an embodiment, a plurality of substrates W may be vertically stacked/loaded in one boat 5.

Figure 9:
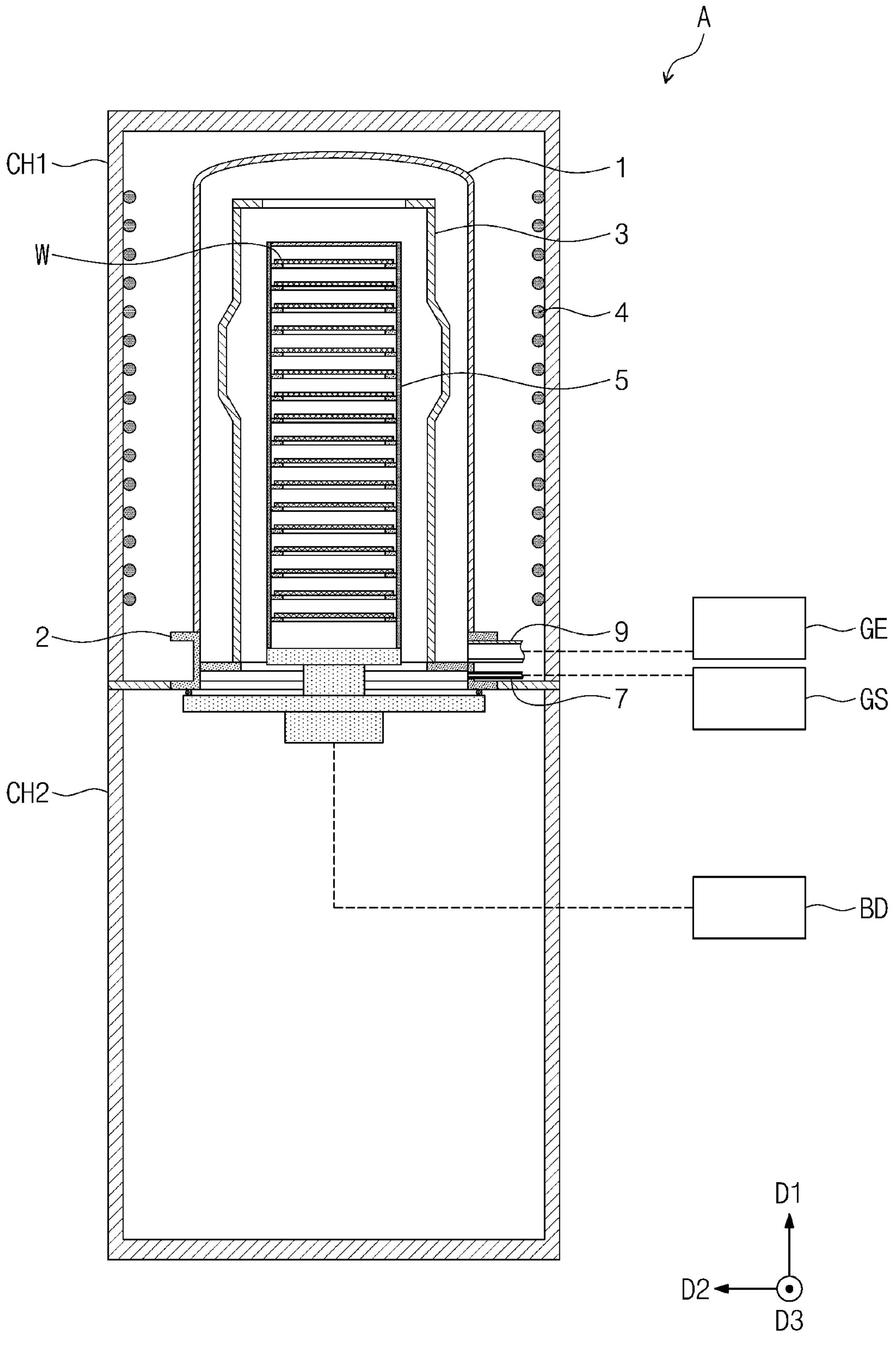

Referring to FIG. 9, the boat 5, in which the substrate W is loaded, may move in an upward direction and may be inserted/disposed into the upper chamber CH1. For example, the boat 5 may be inserted/disposed in the inner tube 3. For example, the boat 5 loaded with substrates may move into the inner tube 3 before a process is performed on the substrates and may move out of the inner tube 3 after the process is performed on the substrates.

Figure 10:
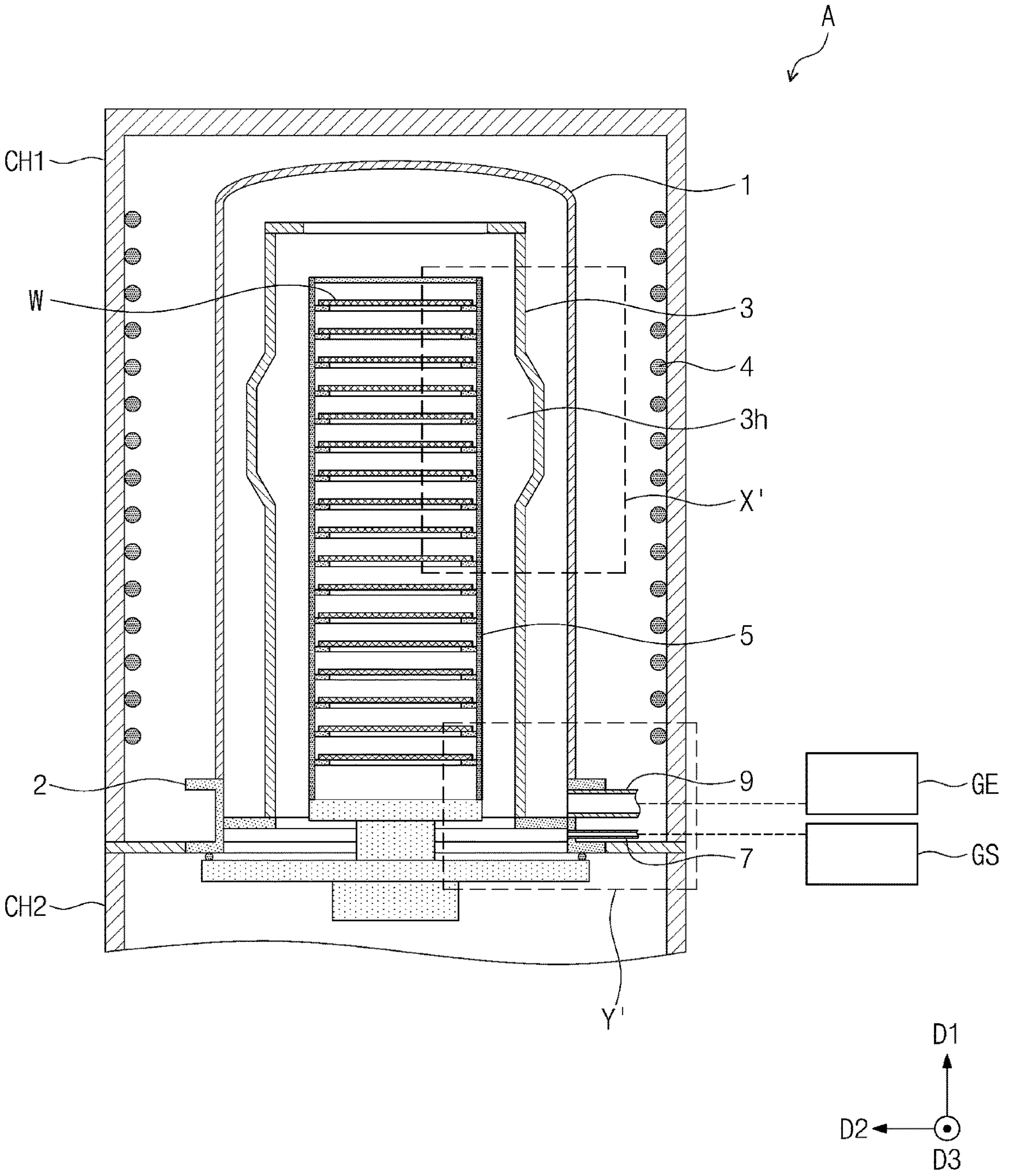
Figure 11:
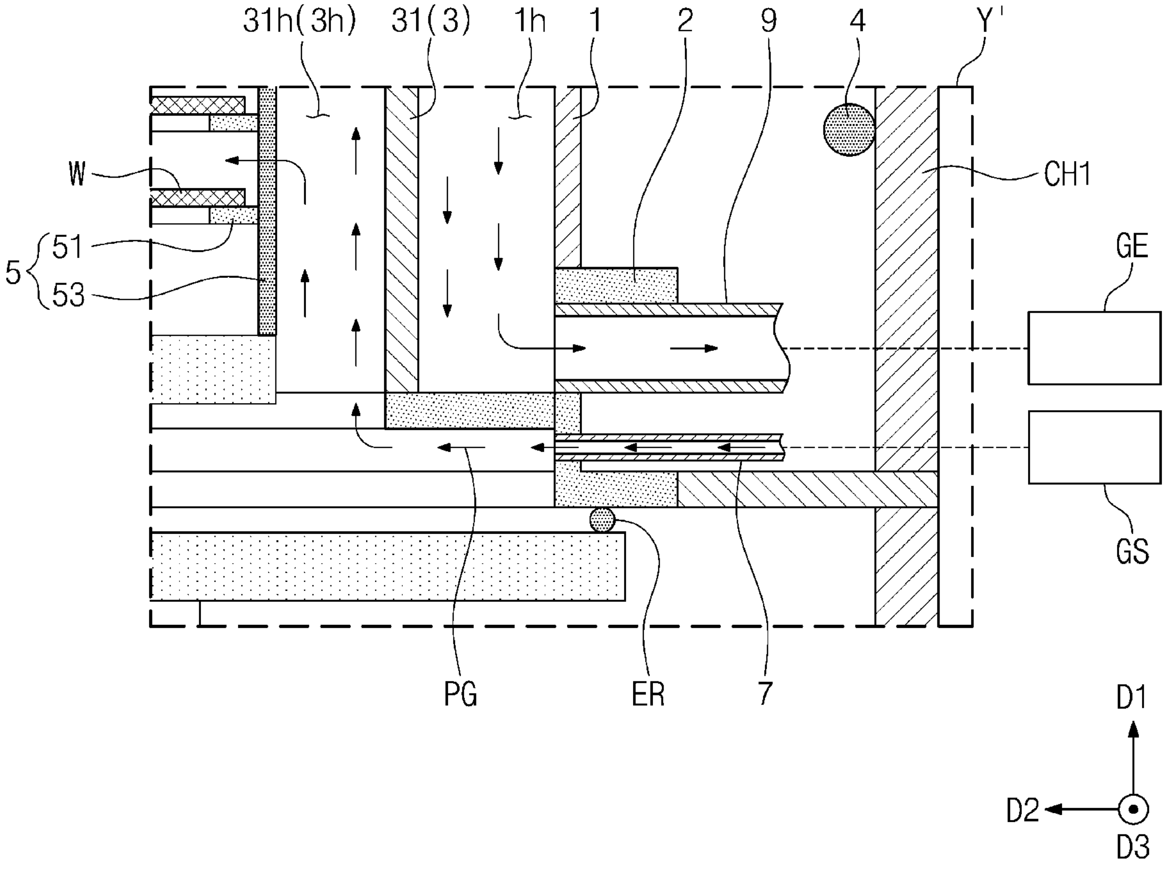

Referring to FIGS. 10, 11, and 7, the supplying of the process gas into the substrate processing apparatus (in S1) may include supplying a process gas PG, which is supplied from the gas supplying part GS, into the process space 3*h* through the gas supplying conduit 7. In the inner tube 3, the process gas PG, which is supplied into the process space 3*h*, may move in an upward direction.

Figure 12:
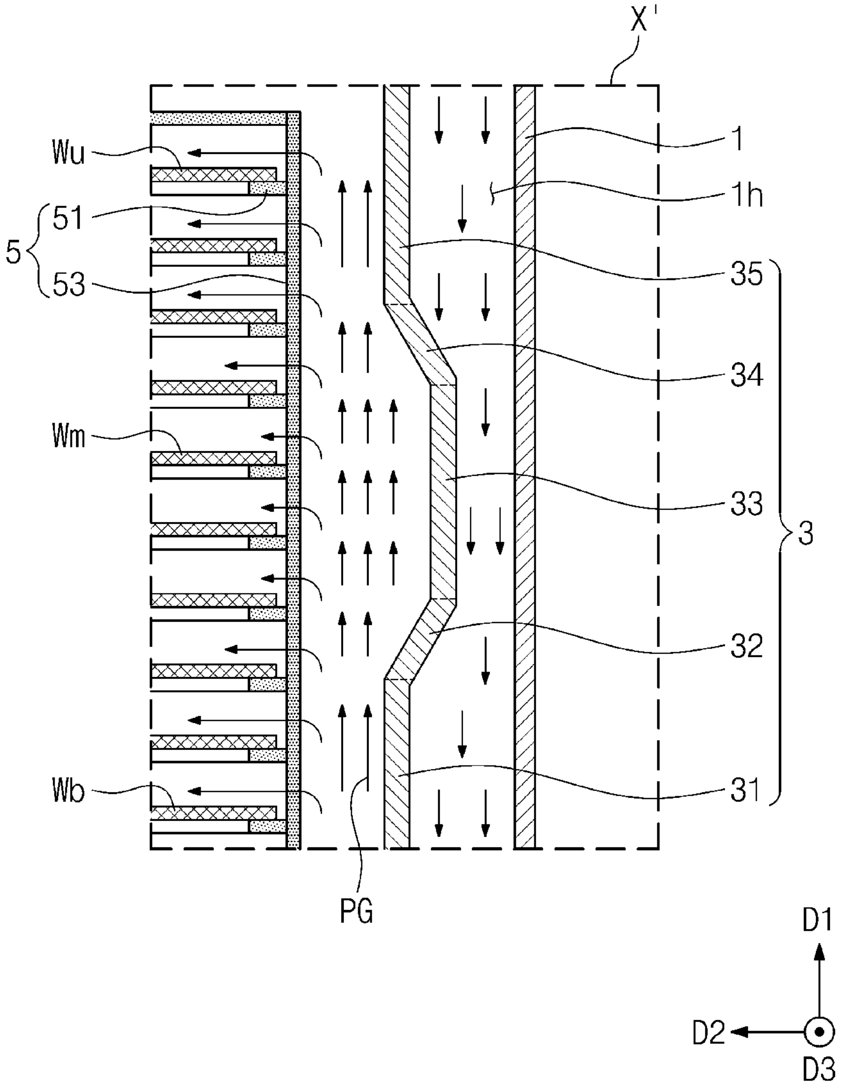

Referring to FIG. 12, a speed of the process gas PG passing through the first position may be different from a speed of the process gas PG passing through the second position. The process gas PG may pass through the first position at a first speed. In an embodiment, the first position may be located at the same level as the first inner tube 31. The process gas PG may pass through the second position at a second speed. In an embodiment, the second position may be located at the same level as the third inner tube 33. A sectional area of a conduit/passage, through which the process gas PG passes, may be smaller at the first position than at the second position. Thus, an elevation speed (e.g., an average speed of gas molecules) of the process gas PG passing through the first position may be greater than an elevation speed (e.g., an average speed of gas molecules) of the process gas PG passing through the second position. For example, the first speed may be greater than the second speed.

A portion of the process gas PG moving in an upward direction may be supplied toward a region on the substrate W, which is loaded on the boat 5. In the case where the process gas PG moves in the upward direction at a high speed, an amount of the process gas PG supplied onto the substrate W may increase. In the case where the process gas PG moves in the upward direction at a low speed, an amount of the process gas PG supplied onto the substrate W may decrease. Thus, an amount of the process gas PG, which is supplied from the first position toward the substrate W, may be larger/greater than an amount of the process gas PG, which is supplied from the second position toward the substrate W. For example, an amount of the process gas PG, which is supplied toward a substrate Wb at a lower level, may be larger/greater than an amount of the process gas PG, which is supplied toward a substrate Wm at an intermediate level. In addition, an amount of the process gas PG, which is supplied toward a substrate Wu at an upper level, may be larger than the amount of the process gas PG supplied toward the substrate Wm. For example, the variation of the inner diameter of the inner tube 3 may be used to control an amount of the process gas PG supplied toward a substrate.

Referring to FIGS. 12 and 7, the depositing of the process gas on the substrate in the substrate processing apparatus (in S2) may include depositing a portion of the process gas PG, which is supplied toward the substrate, on the substrate. Physical and chemical characteristics of a layer deposited on the substrate may depend on an amount of the process gas PG supplied toward the substrate. For example, since the amount of the process gas PG supplied toward the substrate Wb at the lower level is large, the deposited layer may have a relatively large thickness. By contrast, since a small amount of the process gas PG is supplied toward the substrate Wm at the intermediate level, the deposited layer may have a relatively small thickness.

Referring back to FIGS. 11 and 7, the exhausting/discharging of the process gas from the substrate processing apparatus (in S3) may include exhausting/discharging the process gas PG to the outside through the gas exhausting conduit 9.

In the substrate processing tube according to an embodiment of the inventive concept, the substrate processing apparatus including the same, and the substrate processing method using the apparatus, by adjusting the inner diameter of the inner tube, it may be possible to control a speed of the process gas flowing through the inner tube. This may make it possible to control an amount of the process gas supplied to the substrate. For example, by controlling flow of the process gas, it may be possible to uniformly supply the process gas. Thus, it may be possible to reduce a difference in deposition thickness between the substrates, which are vertically stacked in the inner tube. For example, the substrate processing tube may be helpful for improving uniformity of layers between substrates and/or within the substrates formed by the process gas.

In the substrate processing tube according to an embodiment of the inventive concept, the substrate processing apparatus including the same, and the substrate processing method using the apparatus, it may be possible to reduce a variation in process characteristics of the substrates and thereby to improve a fabrication yield.

Figure 13:
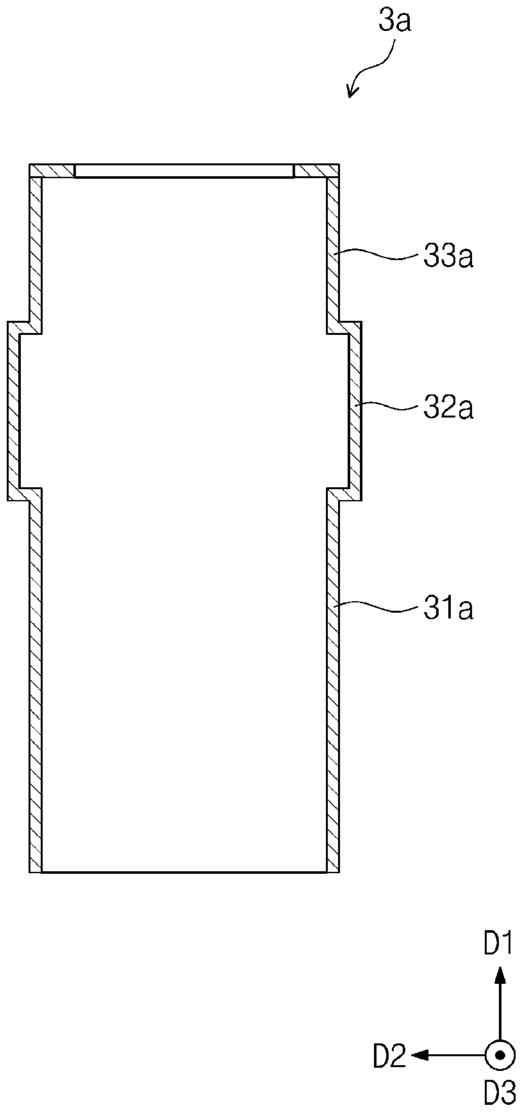
FIG. 13 is a sectional view illustrating an inner tube according to an embodiment of the inventive concept.

FIG. 13 is a sectional view illustrating an inner tube according to an embodiment of the inventive concept.

Referring to FIG. 13, an inner tube 3*a* may include a first inner tube 31*a*, a second inner tube 32*a*, and a third inner tube 33*a*. However, the first inner tube 31*a* and the second inner tube 32*a* may be connected to form a stepwise structure, unlike the structure described with reference to FIG. 5. Similarly, the second inner tube 32*a* and the third inner tube 33*a* may also be connected to form a stepwise structure. The shapes of jointing portions of the tubes may be changed to control flow of the process gas.

Figure 14:
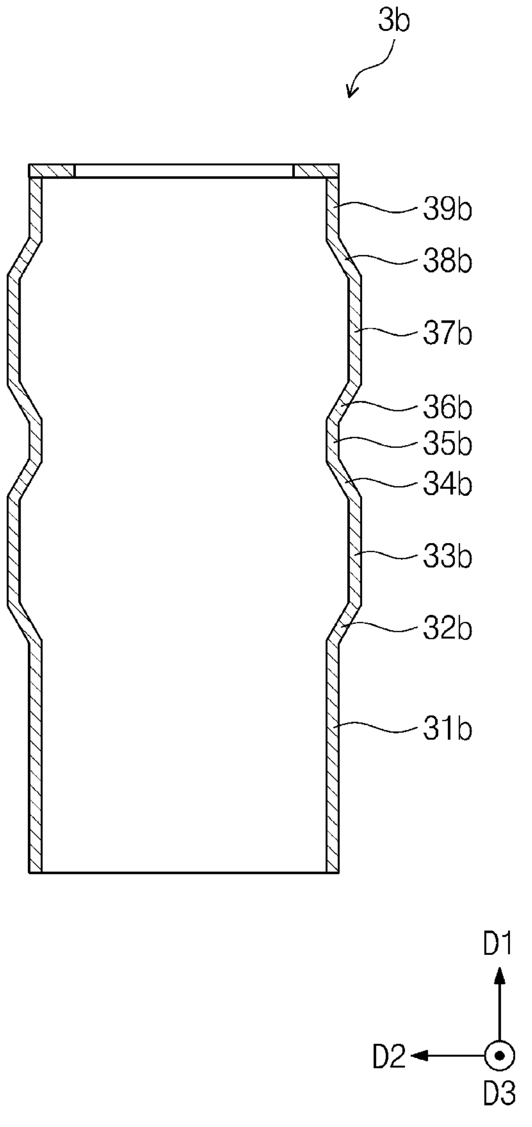
FIG. 14 is a sectional view illustrating an inner tube according to an embodiment of the inventive concept.

FIG. 14 is a sectional view illustrating an inner tube according to an embodiment of the inventive concept.

Referring to FIG. 14, an inner tube 3*b* may include a first inner tube 31*b*, a second inner tube 32*b*, a third inner tube 33*b*, a fourth inner tube 34*b*, a fifth inner tube 35*b*, a sixth inner tube 36*b*, a seventh inner tube 37*b*, an eighth inner tube 38*b*, and a ninth inner tube 39*b*. For example, the inner tube 3*b* of FIG. 14 may include two convex portions, unlike the structure described with reference to FIG. 5.

Figure 15:
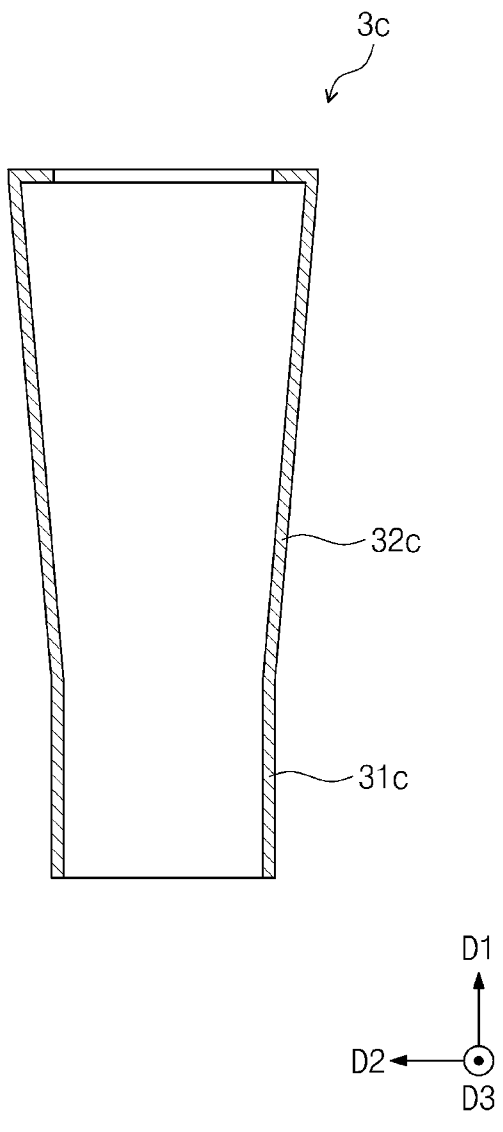
FIG. 15 is a sectional view illustrating an inner tube according to an embodiment of the inventive concept.

FIG. 15 is a sectional view illustrating an inner tube according to an embodiment of the inventive concept.

Referring to FIG. 15, an inner tube 3*c* may include a first inner tube 31*c* and a second inner tube 32*c*. However, an inner diameter of the second inner tube 32*c* of FIG. 15 may increase in an upward direction, unlike the structure described with reference to FIG. 5. For example, the inner tube 3*c* of FIG. 15, except for the first inner tube 31*c*, may have an inner diameter gradually increasing in an upward direction.

Figure 16:
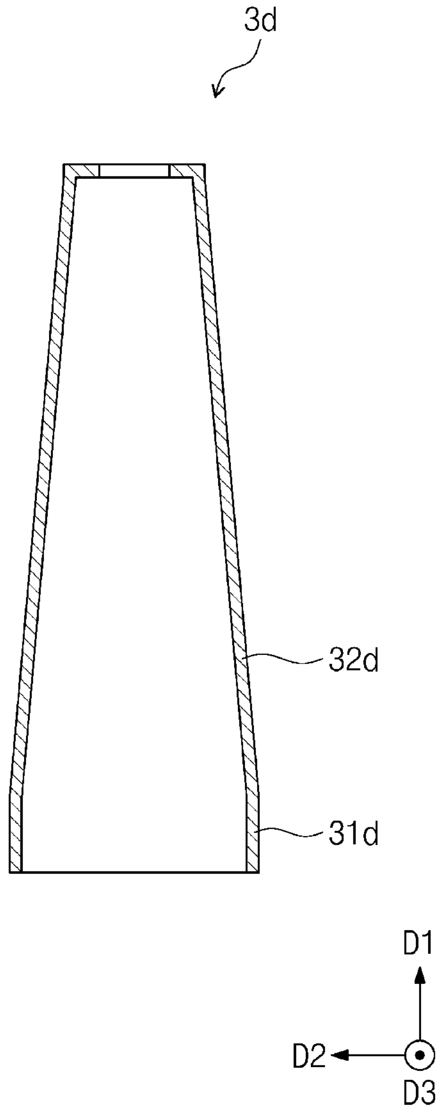
FIG. 16 is a sectional view illustrating an inner tube according to an embodiment of the inventive concept.

FIG. 16 is a sectional view illustrating an inner tube according to an embodiment of the inventive concept.

Referring to FIG. 16, an inner tube 3*d* may include a first inner tube 31*d* and a second inner tube 32*d*. However, unlike the structure described with reference to FIG. 5, the second inner tube 32*d* of FIG. 16 may have an inner diameter decreasing in an upward direction. For example, the inner tube 3*d* of FIG. 16, except for the first inner tube 31*d*, may have an inner diameter gradually decreasing in an upward direction (in a direction moving upwards).

Figure 17:
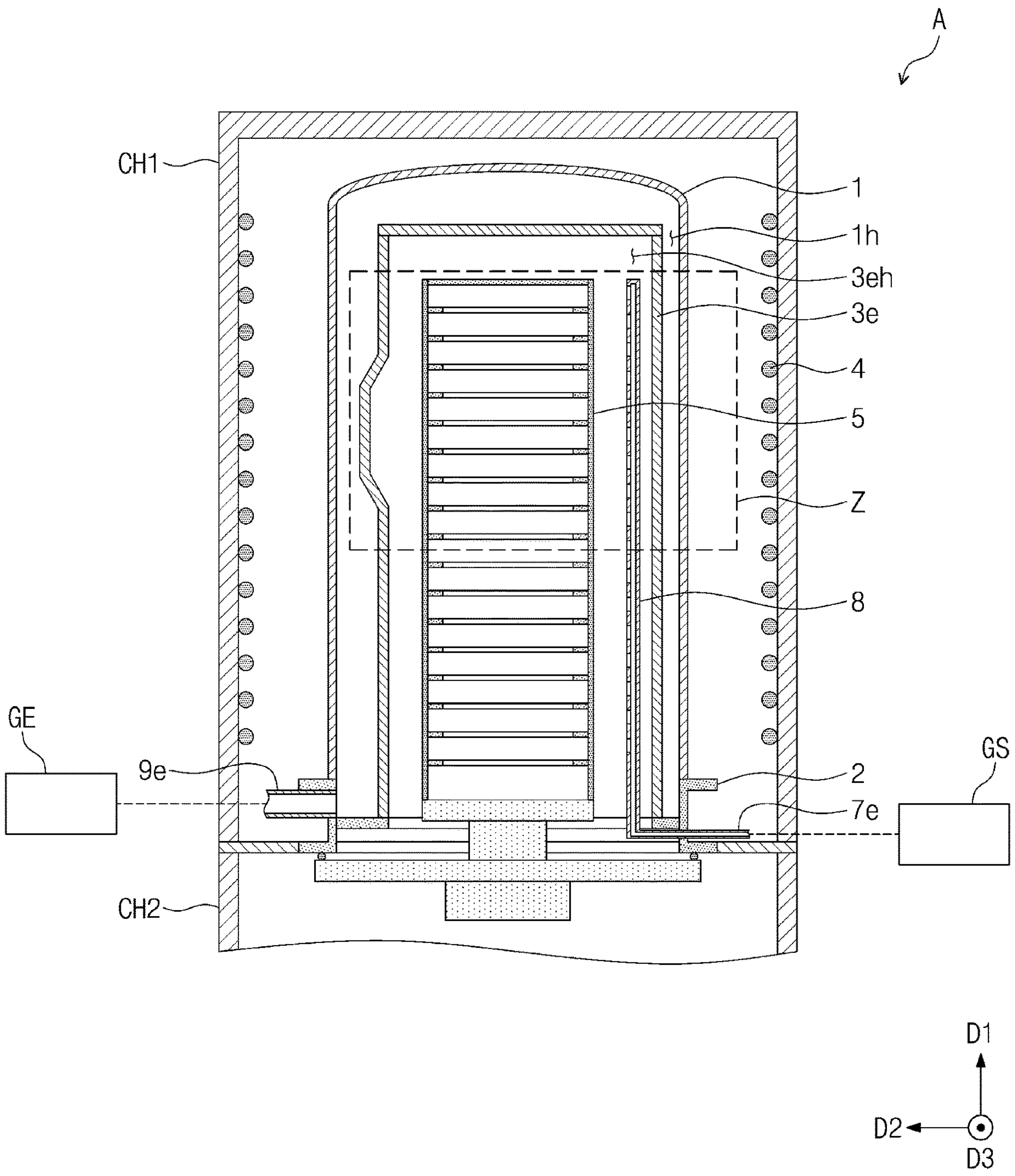
FIG. 17 is a sectional view illustrating a portion of a substrate processing apparatus according to an embodiment of the inventive concept.
Figure 18:
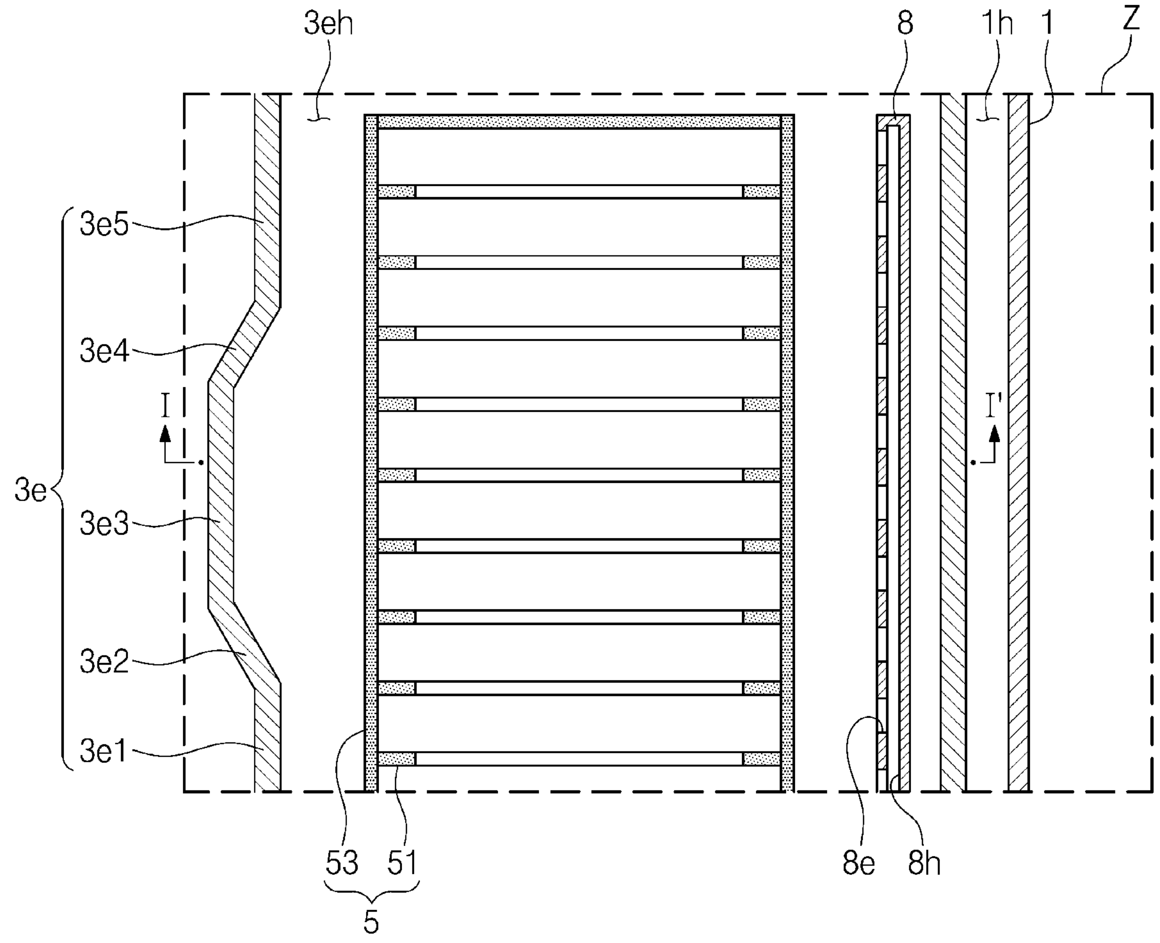
FIG. 18 is an enlarged sectional view illustrating a portion Z of FIG. 17.

FIG. 17 is a sectional view illustrating a portion of a substrate processing apparatus according to an embodiment of the inventive concept, and FIG. 18 is an enlarged sectional view illustrating a portion Z of FIG. 17.

Referring to FIGS. 17 and 18, the substrate processing apparatus A may further include a nozzle 8. The nozzle 8 may be connected to a gas supplying conduit 7*e*. The nozzle 8 may be located in an inner tube 3*e*. The nozzle 8 may vertically extend. The nozzle 8 may provide a nozzle conduit 8*h* and an ejection hole 8*e*. The nozzle conduit 8*h* may vertically extend. The ejection hole 8*e* may extend from the nozzle conduit 8*h* in a horizontal direction. The nozzle conduit 8*h* may be exposed to a process space 3*eh* through the ejection hole 8*e*.

The inner tube 3*e* may include a first inner tube 3*e*1, a second inner tube 3*e*2, a third inner tube 3*e*3, a fourth inner tube 3*e*4, and a fifth inner tube 3*e*5.

An inner diameter of the third inner tube 3*e*3 may be larger than an inner diameter of the first inner tube 3*e*1. However, at a position near the nozzle 8, an inner side surface of the third inner tube 3*e*3 and an inner side surface of the first inner tube 3*e*1 may be located on two different vertical lines that are horizontally spaced apart from each other. This will be described in more detail with reference to FIG. 19.

Figure 19:
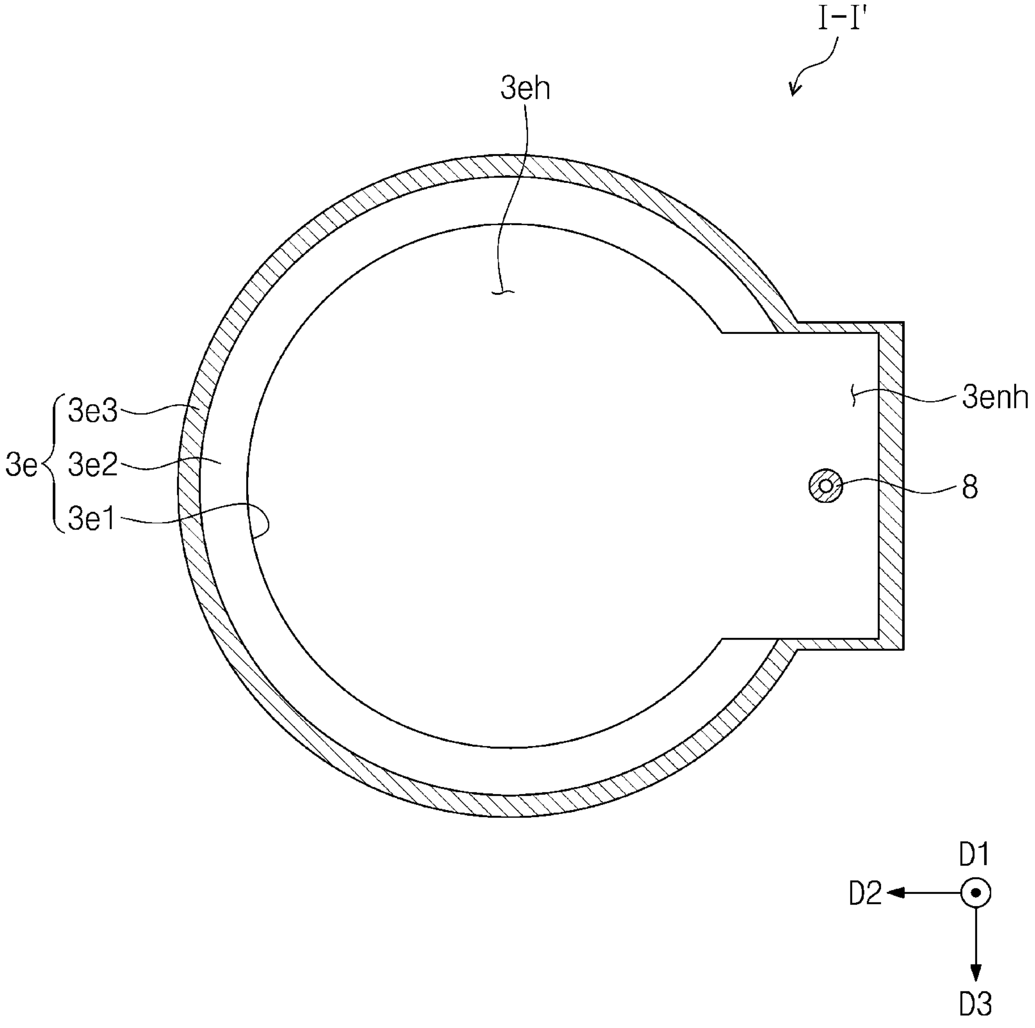
FIG. 19 is a sectional view taken along a line I-I' of FIG. 18.

FIG. 19 is a sectional view taken along a line I-I' of FIG. 18.

Referring to FIG. 19, the inner tube 3*e* may further provide a nozzle region 3*enh*. The nozzle region 3*enh* may be formed by connecting a first nozzle region (not referenced) provided within a first inner tube 3*e*1 to a second nozzle region (not referenced) provided within a second inner tube 3*e*2. The nozzle region 3*enh* may be placed outside the process space 3*eh*. The nozzle 8 may be disposed in the nozzle region 3*enh*.

Figure 20:
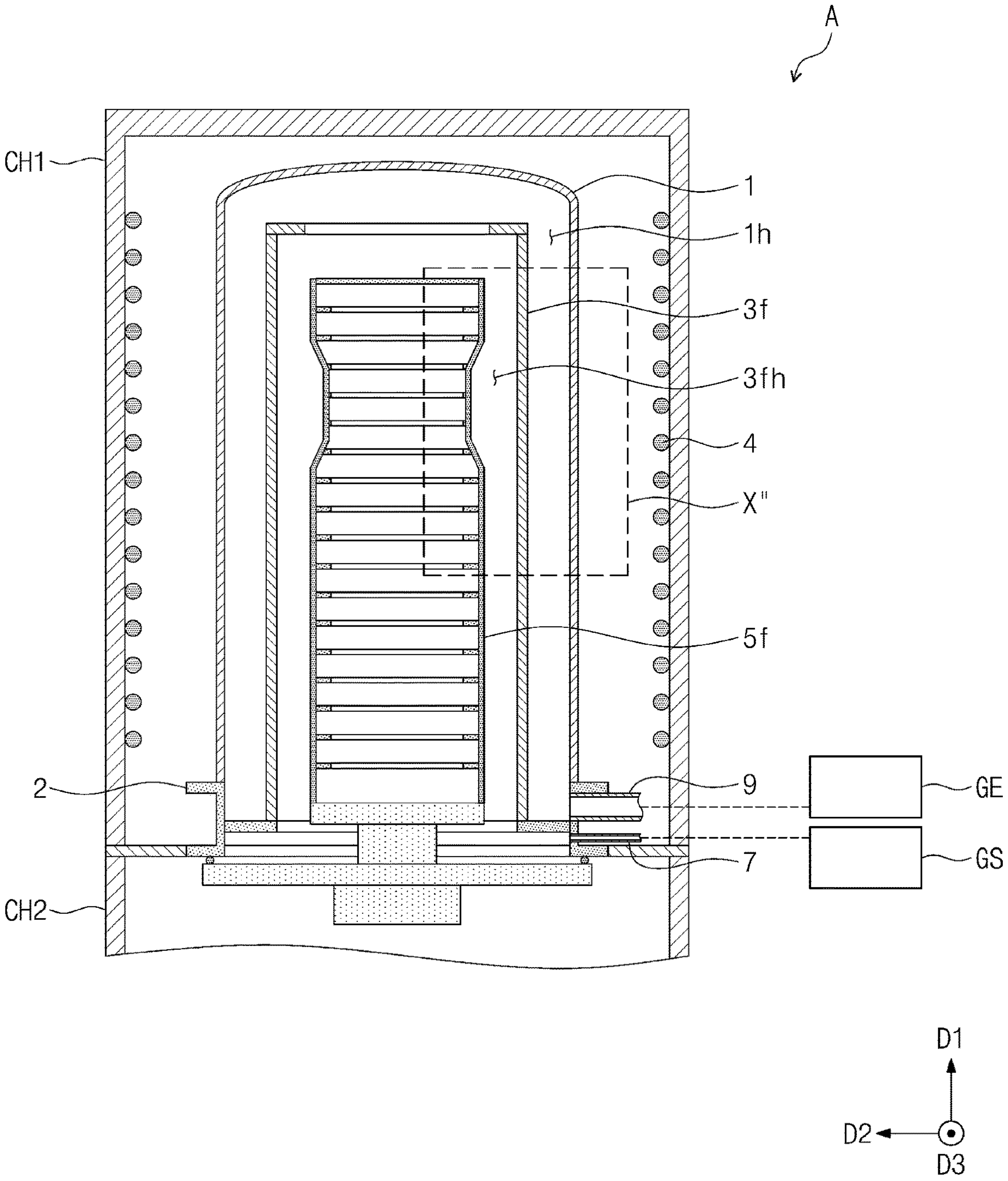
FIG. 20 is a sectional view illustrating a portion of substrate processing apparatus according to an embodiment of the inventive concept.
Figure 21:
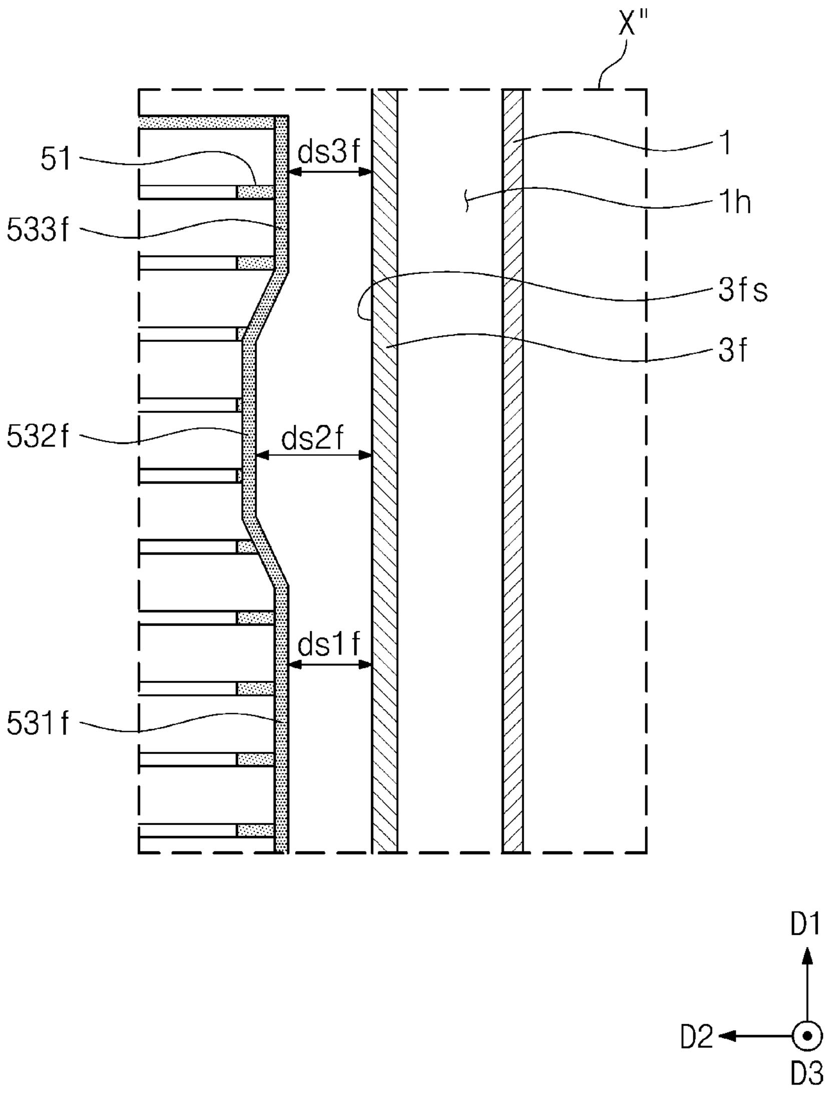
FIG. 21 is an enlarged sectional view illustrating a portion X" of FIG. 20.

FIG. 20 is a sectional view illustrating a portion of the substrate processing apparatus According to an embodiment of the inventive concept, and FIG. 21 is an enlarged sectional view illustrating a portion X" of FIG. 20.

Referring to FIGS. 20 and 21, an outer diameter of a boat 5*f* may not be constant. For example, the boat 5*f* may include a first connection member/portion 531*f*, a second connection member/portion 532*f*, and a third connection member/portion 533*f*. The first connection member 531*f*, the second connection member 532*f*, and the third connection member 533*f* may be vertically connected to each other. An outer diameter of the first connection member 531*f* may be different from an outer diameter of the second connection member 532*f*. In addition, an outer diameter of the third connection member 533*f* may be different from the outer diameter of the second connection member 532*f*. For example, an outer diameter of a connection member may be a diameter of a circle formed by an outer surface of the connection member in a cross-sectional view. By contrast, an inner diameter of the inner tube 3*f* may be constant. For example, the inner diameter of the inner tube 3*f* may be the same throughout the inner tube 3*f* Accordingly, a width of a process space 3*fh* may be constant. For example, a width of a process space 3*fh* in a horizontal direction may be the same throughout the inner tube 3*f*. Thus, a distance between the boat 5*f* and the inner tube 3*f* may not be constant. For example, a first horizontal distance ds1*f* between the boat 5*f* and an inner side surface 3*fs* of the inner tube 3*f* at the first position may be different from a second horizontal distance ds2*f* between the boat 5*f* and the inner side surface 3*fs* of the inner tube 3*f* at the second position. In addition, a third horizontal distance ds3*f* between the boat 5*f* and the inner side surface 3*fs* of the inner tube 3*f* at the third position may be different from the second horizontal distance ds2*f* between the boat 5*f* and the inner side surface 3*fs* of the inner tube 3*f* at the second position.

In the substrate processing tube according to an embodiment of the inventive concept, the substrate processing apparatus including the same, and the substrate processing method using the apparatus, by adjusting the outer diameter of the boat, it may be possible to realize a variation in the horizontal distance between the boat and the inner tube. For example, even when the shape of the inner tube is not changed, the flow of the process gas may be controlled by changing the shape of the boat.

Figure 22:
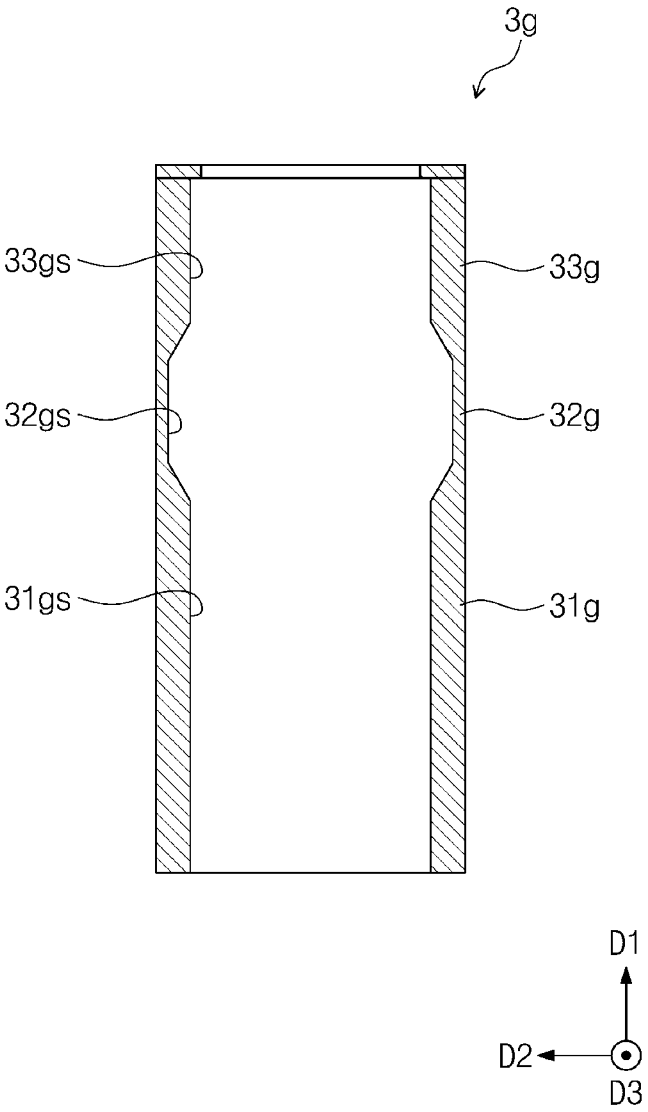
FIG. 22 is a sectional view illustrating an inner tube according to an embodiment of the inventive concept.

FIG. 22 is a sectional view illustrating an inner tube according to an embodiment of the inventive concept.

Referring to FIG. 22, an inner tube 3*g* may include a first inner tube 31*g*, a second inner tube 32*g*, and a third inner tube 33*g*. However, unlike the structure described with reference to FIG. 5, the first inner tube 31*g*, the second inner tube 32*g*, and the third inner tube 33*g* may have outer surfaces that are located on a single vertical line, when viewed in a sectional view. By contrast, an inner side surface 31*gs* of the first inner tube 31*g* and an inner side surface 32*gs* of the second inner tube 32*g* may be located on two different vertical lines that are horizontally spaced apart from each other, when viewed in a sectional view. In addition, an inner side surface 33*gs* of the third inner tube 33*g* may be placed on a curved surface that is different from the inner side surface 32*gs* of the second inner tube 32*g*. For example, the inner side surface 33*gs* of the third inner tube 33*g* may have a diameter that is different from a diameter of the inner side surface 32*gs* of the second inner tube 32*g*, and the inner side surface 31*gs* of the first inner tube 31*g* may have a diameter that is different from the diameter of the inner side surface 32*gs* of the second inner tube 32*g* while outer side surfaces of the first, second and third inner tubes 31*g*, 32*g* and 33*g* have the same diameters.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally unless the context indicates otherwise.

In a substrate processing tube according to an embodiment of the inventive concept, a substrate processing apparatus including the same, and a substrate processing method using the apparatus, it may be possible to control flow of a process gas.

In a substrate processing tube according to an embodiment of the inventive concept, a substrate processing apparatus including the same, and a substrate processing method using the apparatus, it may be possible to uniformly distribute a process gas.

In a substrate processing tube according to an embodiment of the inventive concept, a substrate processing apparatus including the same, and a substrate processing method using the apparatus, it may be possible to increase a yield of a fabrication process.

While example embodiments of the inventive concept have been particularly shown and described, it will be understood by one of ordinary skill in the art that variations in form and detail may be made therein without departing from the spirit and scope of the attached claims.

What is claimed is:

1. A substrate processing apparatus, comprising:
- an inner tube providing a process space extending vertically;
- an outer tube enclosing the inner tube;
- a gas supplying conduit connected to the process space; and
- a boat configured to be disposed in the process space,
- wherein a first inner diameter of the inner tube at a first position is different from a second inner diameter of the inner tube at a second position,
- wherein a level of the second position is higher than a level of the first position, and
- wherein, in a horizontal cross-section at the second position, an inner circumference of the inner tube has a circular shape along an entire perimeter of the inner tube, and
- wherein the level of the second position is within a vertical extent of the boat.

2. The substrate processing apparatus of claim 1, wherein the boat comprises a plurality of substrate supports,
- the substrate supports are vertically arranged, and
- when the boat is disposed in the process space, a level of the uppermost one of the substrate supports is higher than the level of the second position.

3. The substrate processing apparatus of claim 1, wherein the second inner diameter is larger than the first inner diameter.

4. The substrate processing apparatus of claim 1, wherein the first inner diameter is in a range from 340 mm to 380 mm, and
- the second inner diameter is in a range from 368 mm to 408 mm.

5. The substrate processing apparatus of claim 1, wherein a third inner diameter of the inner tube at a third position is equal to the first inner diameter, and
- a level of the third position is higher than the level of the second position.

6. The substrate processing apparatus of claim 1, further comprising a flange, which is placed below the outer tube to support the outer tube,
- wherein the flange is provided to enclose the inner tube, and
- the gas supplying conduit is provided to penetrate the flange in a horizontal direction and is connected to the process space.

7. The substrate processing apparatus of claim 6, further comprising a gas exhausting conduit, which is connected to the flange,
- a top of the inner tube is open such that the process space is connected to an outer space formed between the inner tube and the outer tube, and
- the gas exhausting conduit is connected to the outer space.

8. A substrate processing tube, comprising:
- a first inner tube providing a first process space configured such that a deposition process on a first substrate is performed in the first process space; and
- a second inner tube providing a second process space configured such that a deposition process on a second substrate is performed in the second process space,
- wherein the first process space extends in a vertical direction,
- wherein the second process space is connected to the first process space and extends from the first process space in the vertical direction,
- wherein the second process space comprises a first region whose horizontal width is different from a horizontal width of the first process space, and
- wherein, in a horizontal cross-section, the second inner tube has a circular inner circumference extending along an entire perimeter of the second inner tube.

9. The substrate processing tube of claim 8, wherein the horizontal width of the first process space is constant, and
- wherein the second process space comprises a second region whose horizontal width increases in a direction moving upwards.

10. The substrate processing tube of claim 8, wherein a horizontal section of each of the first and second process spaces has a circular shape, the first inner tube further provides a first nozzle region, which is placed outside the first process space and is connected to the first process space, the second inner tube further provides a second nozzle region, which is placed outside the second process space and is connected to the second process space, the first nozzle region extends in a first direction, and the second nozzle region extends from the first nozzle region in the first direction.

11. The substrate processing tube of claim 8, wherein the horizontal width of the first process space is in a range from 340 mm to 380 mm.

12. The substrate processing tube of claim 8, wherein the first inner tube and the second inner tube comprise quartz.

13. A substrate processing apparatus, comprising:

an inner tube providing a process space which extends in a first direction;

an outer tube enclosing the inner tube and extending in the first direction;

a gas supplying conduit connected to the process space; and a boat configured to move in and to move out of the process space, wherein, when the boat is placed in the process space, a first horizontal distance between the boat and an inner side surface of the inner tube at a first position is different from a second horizontal distance between the boat and the inner side surface of the inner tube at a second position, wherein the second position is spaced apart from the first position in the first direction, and wherein a horizontal cross-section of the inner side surface of the inner tube at the second position has a circular shape.

14. The substrate processing apparatus of claim 13, wherein a first outer diameter of the boat at the first position is different from a second outer diameter of the boat at the second position.

15. The substrate processing apparatus of claim 13, wherein the boat comprises a plurality of substrate supports, the substrate supports are arranged in the first direction, and when the boat is disposed in the process space, the uppermost one of the substrate supports is located above the second position.

16. The substrate processing apparatus of claim 13, wherein the second horizontal distance is larger than the first horizontal distance.

17. The substrate processing apparatus of claim 16, wherein a third horizontal distance between the boat and the inner side surface of the inner tube at a third position is larger than the second horizontal distance, and the third position is spaced apart from the second position in the first direction.

18. The substrate processing apparatus of claim 13, further comprising a heater enclosing the outer tube, wherein the heater comprises a plurality of heating lines, and the heating lines are arranged in the first direction.

19. The substrate processing apparatus of claim 13, further comprising a flange supporting the outer tube, wherein the flange is provided to enclose the inner tube, and the gas supplying conduit is provided to penetrate the flange and is connected to the process space.

20. The substrate processing apparatus of claim 19, further comprising a nozzle placed in the inner tube, wherein the nozzle is connected to the gas supplying conduit and extends from the gas supplying conduit in the first direction.

* * * * *